(12) United States Patent
Uemura et al.

(10) Patent No.: US 8,324,083 B2
(45) Date of Patent: Dec. 4, 2012

(54) METHOD FOR PRODUCING GROUP III NITRIDE COMPOUND SEMICONDUCTOR ELEMENT

(75) Inventors: Toshiya Uemura, Aichi (JP); Masanobu Ando, Aichi (JP); Tomoharu Shiraki, Aichi (JP); Masahiro Ohashi, Aichi (JP); Naoki Arazoe, Aichi (JP); Ryohei Inazawa, Aichi (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 425 days.

(21) Appl. No.: 12/585,969

(22) Filed: Sep. 29, 2009

(65) Prior Publication Data

US 2010/0081256 A1 Apr. 1, 2010

(30) Foreign Application Priority Data

Sep. 30, 2008 (JP) ................................. 2008-252436
Dec. 26, 2008 (JP) ................................. 2008-334322
Jun. 29, 2009 (JP) ................................. 2009-153226

(51) Int. Cl.
*H01L 21/00* (2006.01)
*H01L 21/30* (2006.01)
*H01L 21/46* (2006.01)

(52) U.S. Cl. ............ 438/462; 438/33; 438/42; 438/456; 438/458; 257/E21.601

(58) Field of Classification Search .................. 438/42, 438/456, 458, 462; 257/E21.601
See application file for complete search history.

(56) References Cited

U.S. PATENT DOCUMENTS 6,617,261 B2 * 9/2003 Wong et al. .................. 438/778
2006/0014310 A1 * 1/2006 Epler et al. .................. 438/22
2008/0070380 A1 * 3/2008 Kusunoki .................. 438/462
2008/0210955 A1 9/2008 Uemura et al.
2009/0029499 A1 * 1/2009 Nakahara .................. 438/46

FOREIGN PATENT DOCUMENTS

JP 2005-109432 A 4/2005
JP 2008-186959 A 8/2008

OTHER PUBLICATIONS

Kelly et al., Appl. Phys. Lett., vol. 69, 1996, pp. 1749-1751.

* cited by examiner

*Primary Examiner* — Matthew Landau
*Assistant Examiner* — Daniel Luke
(74) *Attorney, Agent, or Firm* — McGinn IP Law Group, PLLC

(57) ABSTRACT

A method for producing a Group III nitride compound semiconductor element includes growing an epitaxial layer containing a Group III nitride compound semiconductor using a different kind of substrate as an epitaxial growth substrate, adhering a supporting substrate to the top surface of the epitaxial growth layer through a conductive layer, and then removing the epitaxial growth substrate by laser lift-off. Before adhesion of the epitaxial layer and the supporting substrate, a first groove that at least reaches an interface between the bottom surface of the epitaxial layer and the epitaxial growth substrate from the top surface of the epitaxial layer formed on the epitaxial growth substrate and acts as an air vent communicating with the outside of a wafer when the epitaxial layer and the supporting substrate are joined to each other. Next, the epitaxial layer is divided into each chip by separating the epitaxial growth substrate by laser lift-off, and then removing the epitaxial layer serving as the outer periphery of each chip. Next, the outer peripheral side surface of the epitaxial layer of each chip is at least completely covered with an insulating protective film. Next, the supporting substrate is separated into each chip.

18 Claims, 27 Drawing Sheets

Fig. 2.A
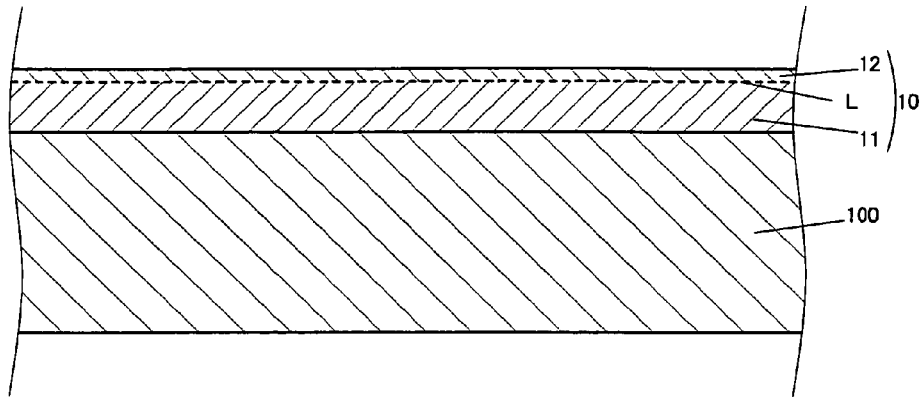
Fig. 2.B
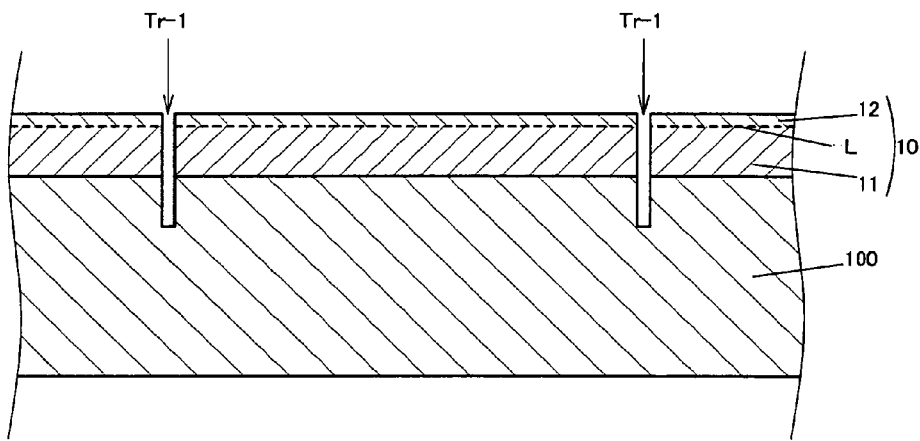
Fig. 2.C
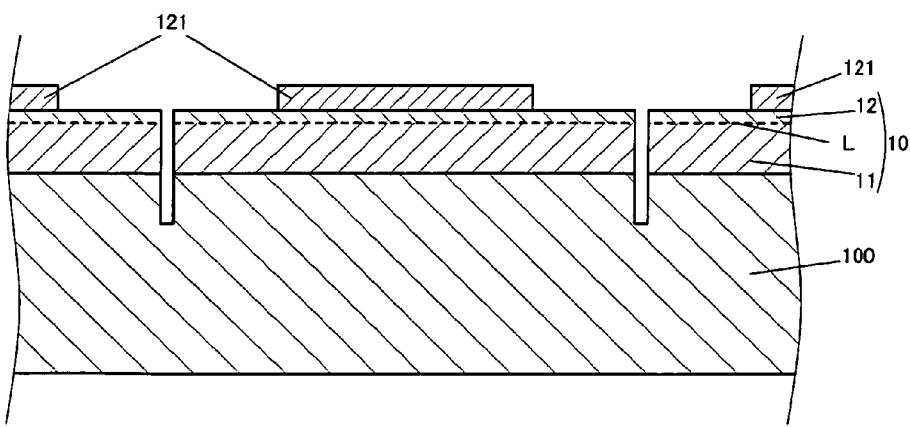

Fig. 2.D
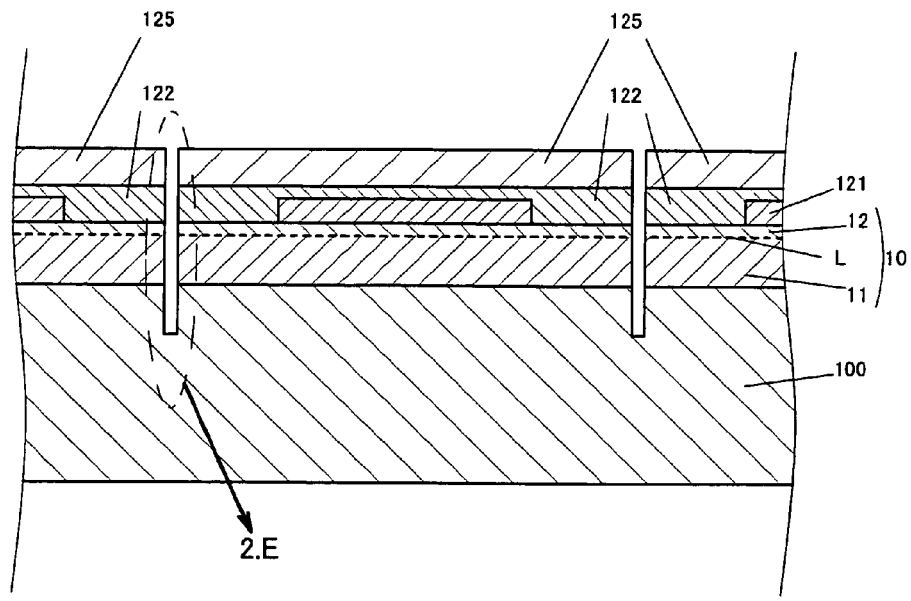
Fig. 2.E
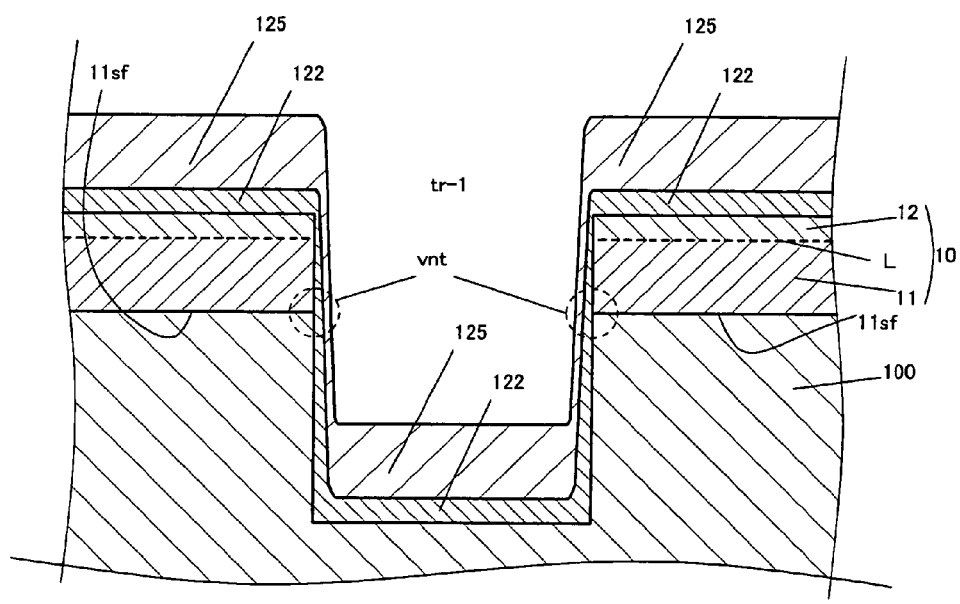

Fig. 2.F
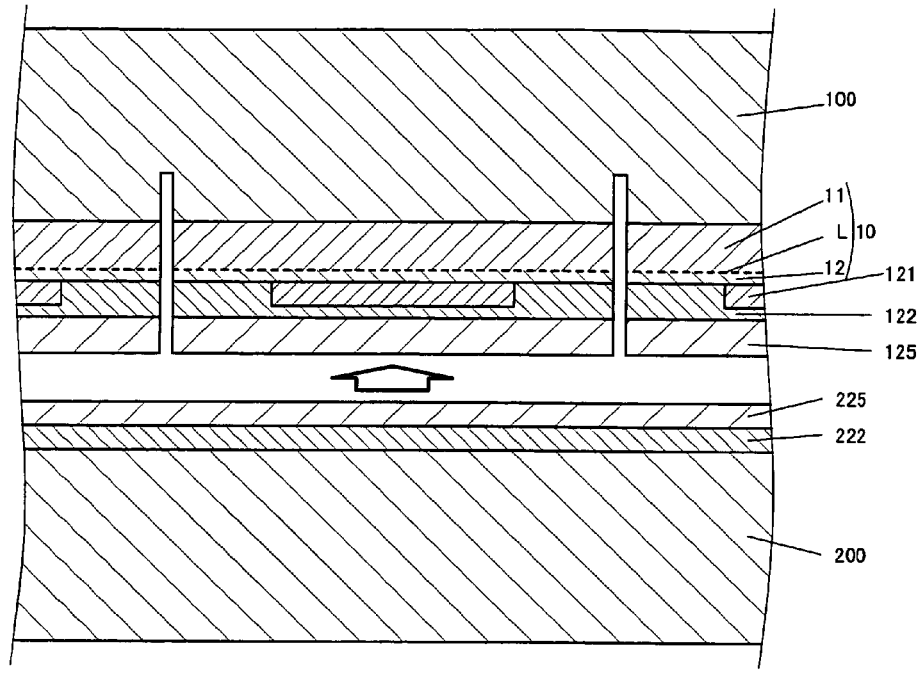
Fig. 2.G
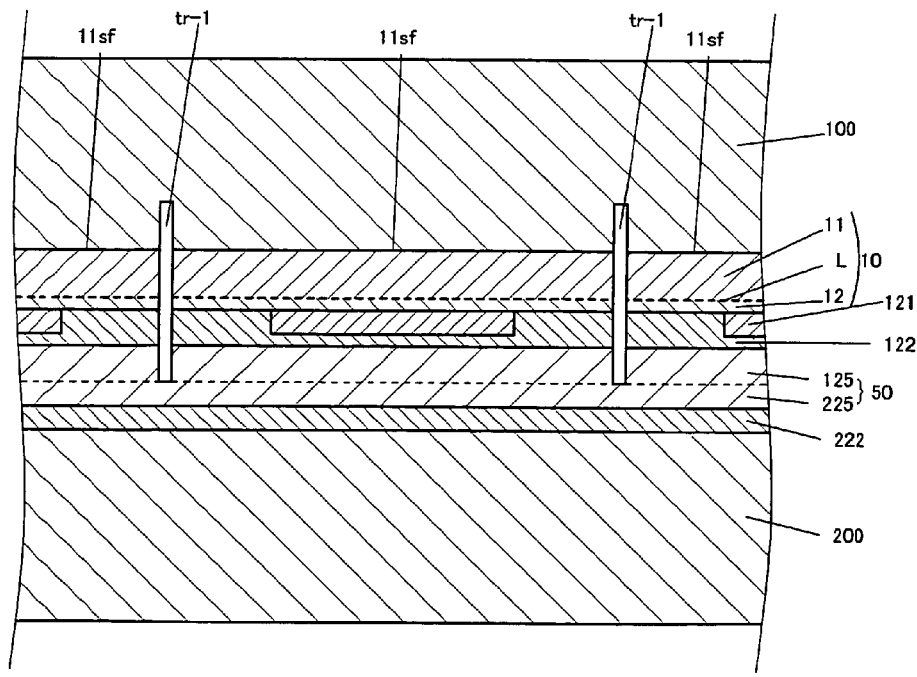

Fig. 2.H
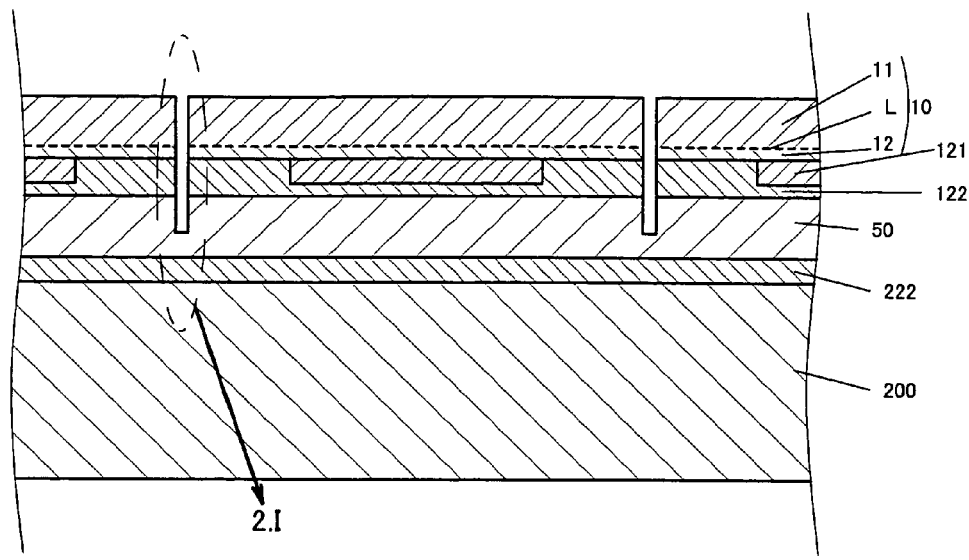
Fig. 2.I
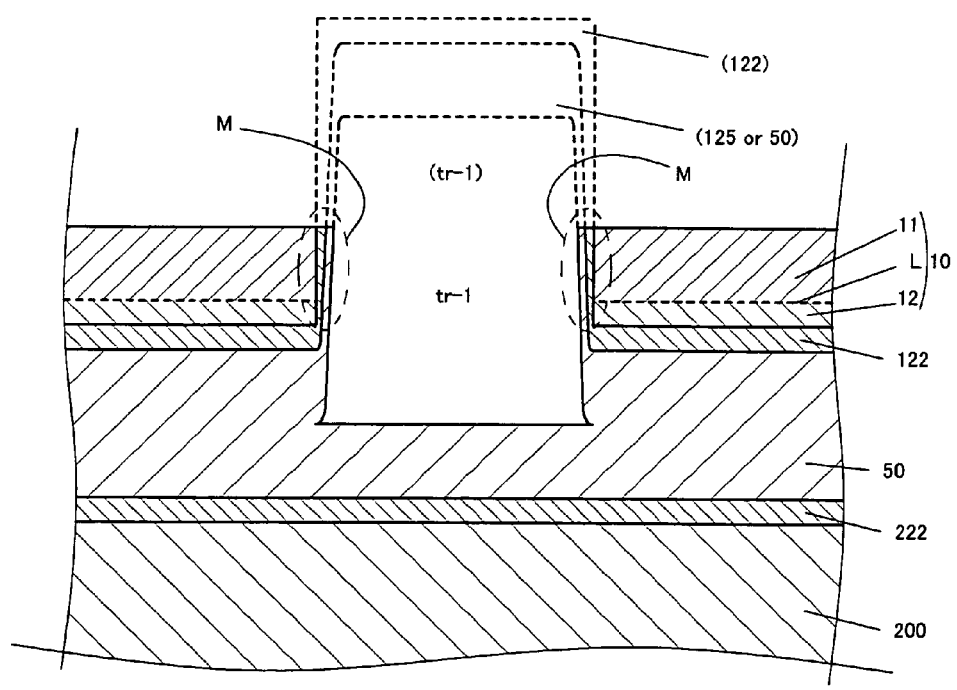

Fig. 2.J
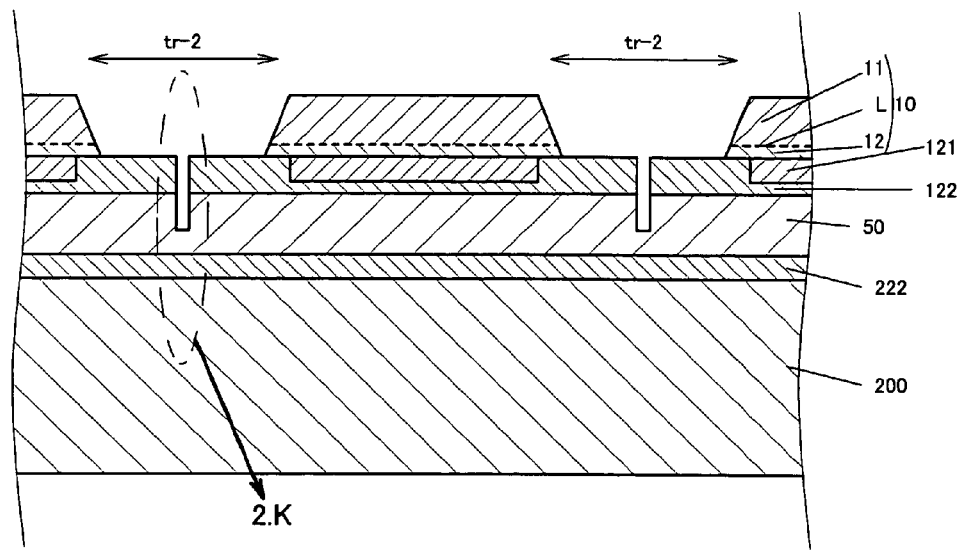
Fig. 2.K
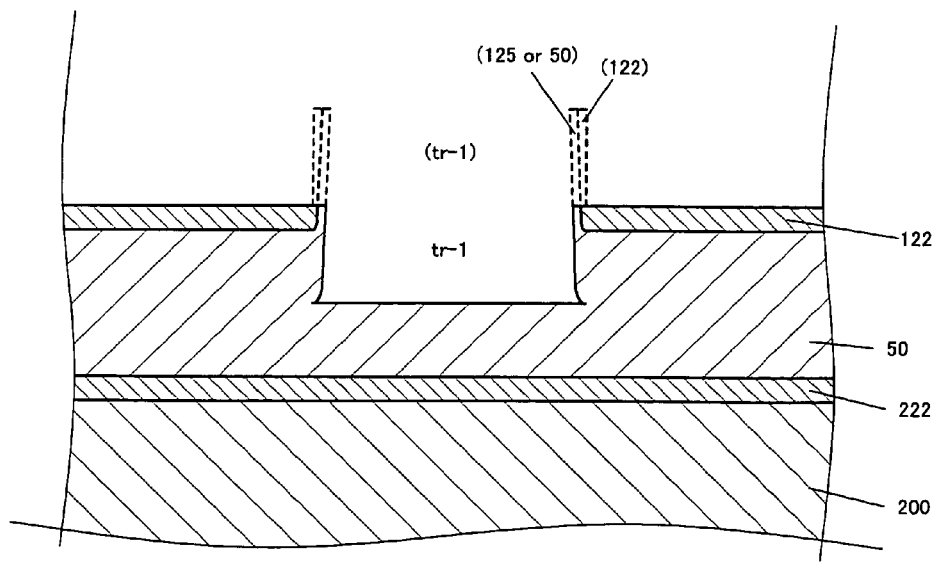

Fig. 2.L
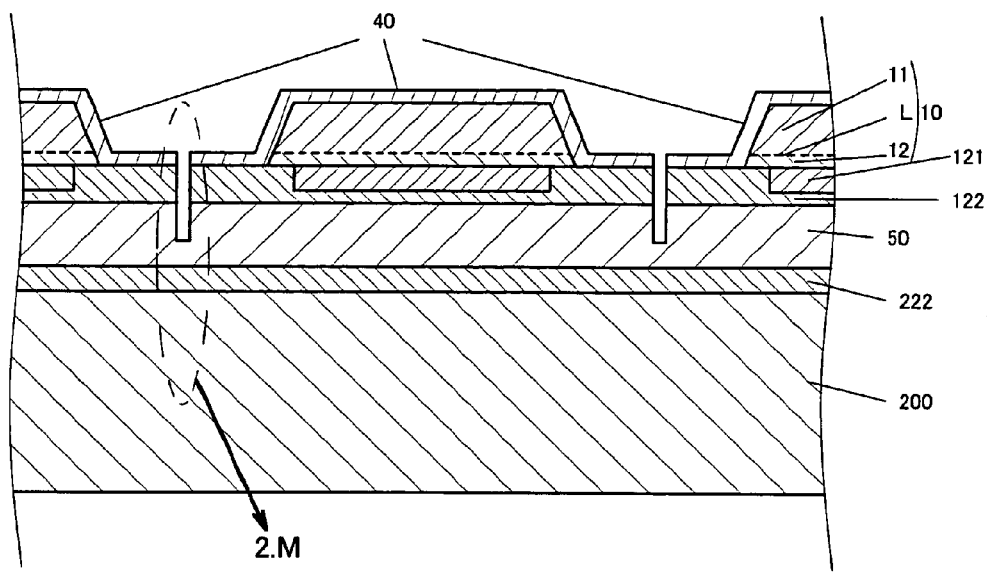
Fig. 2.M
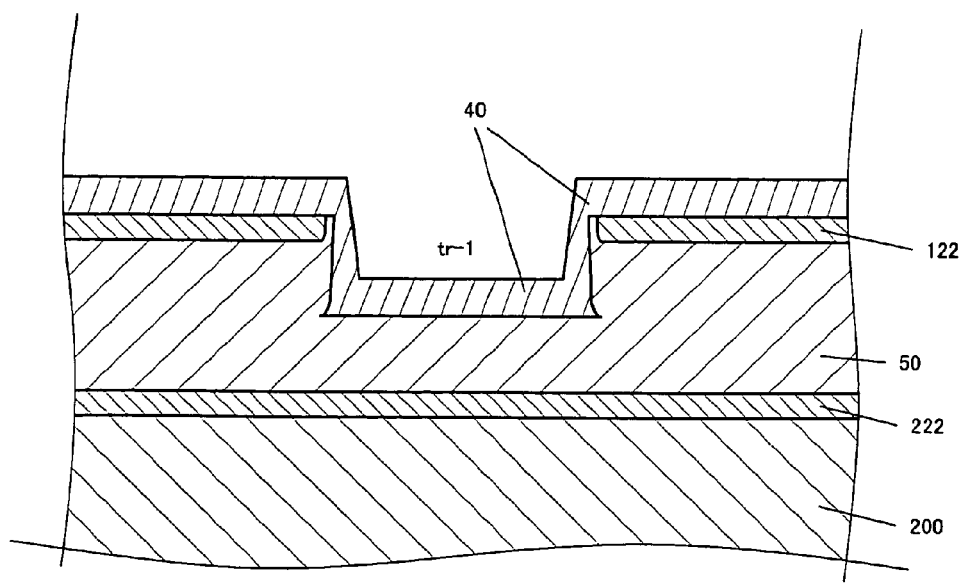

Fig. 2.N
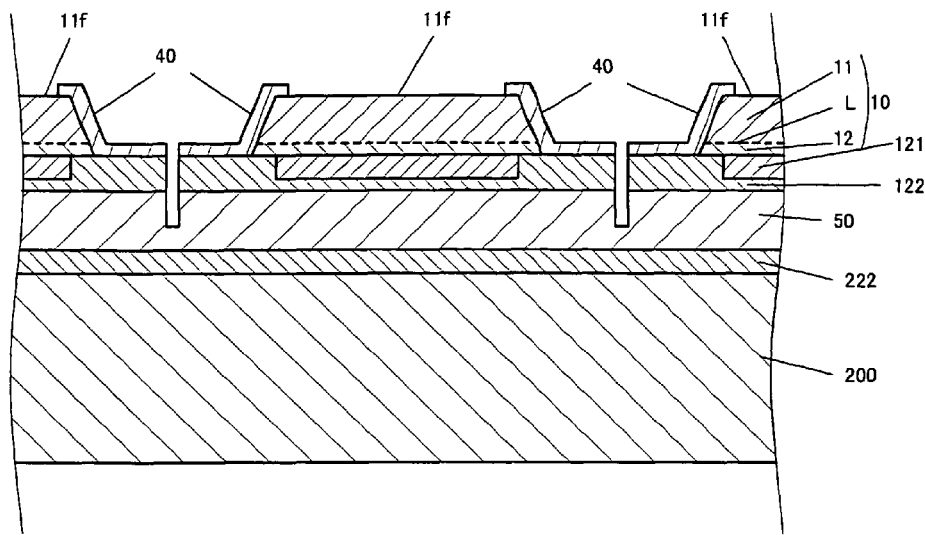
Fig. 2.O
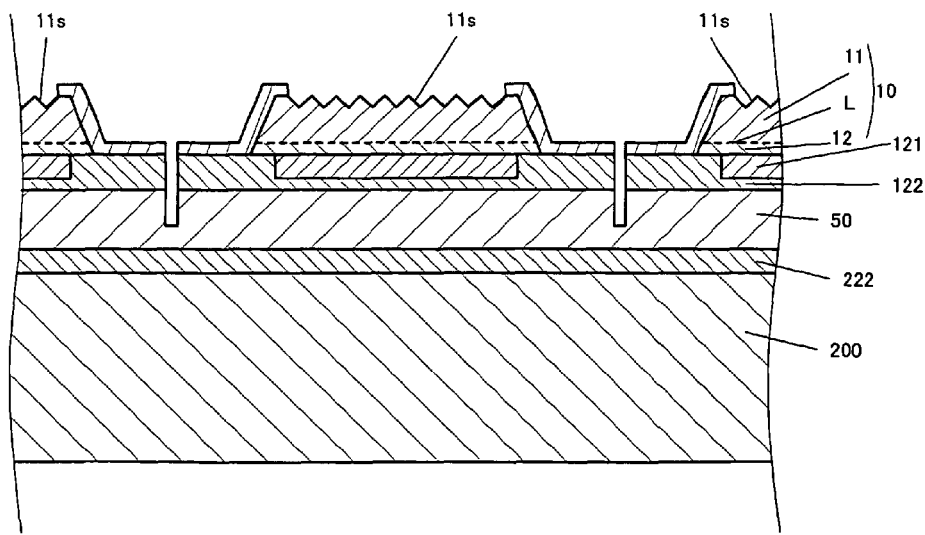

Fig. 2.P
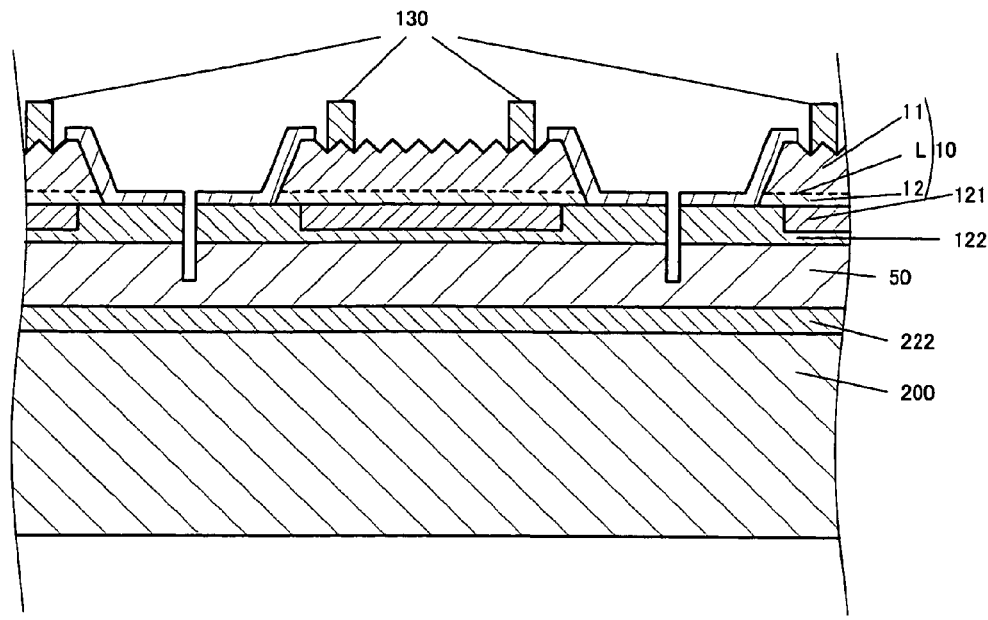
Fig. 2.Q
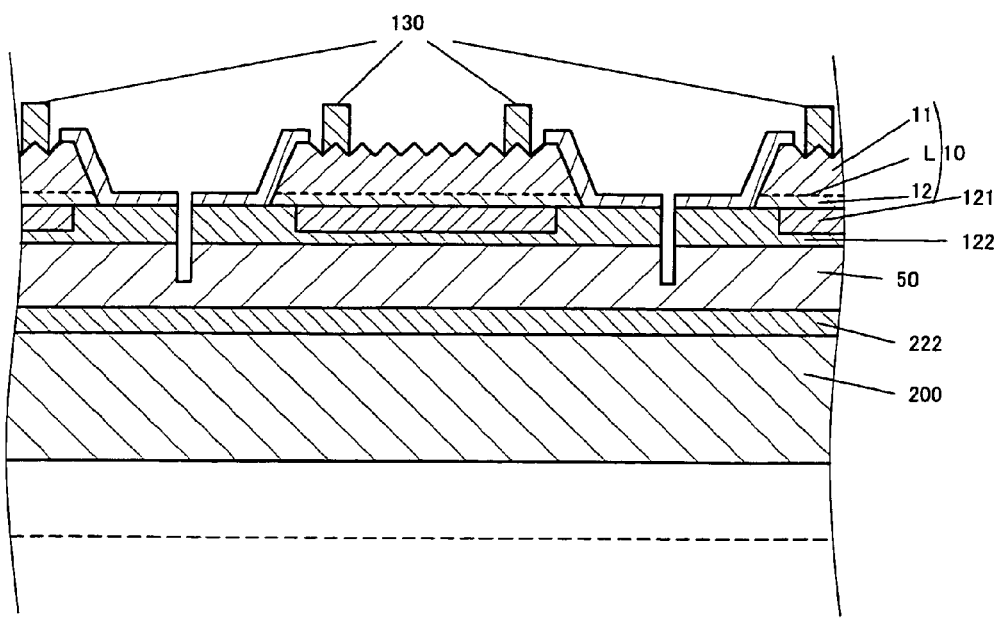

Fig. 2.R
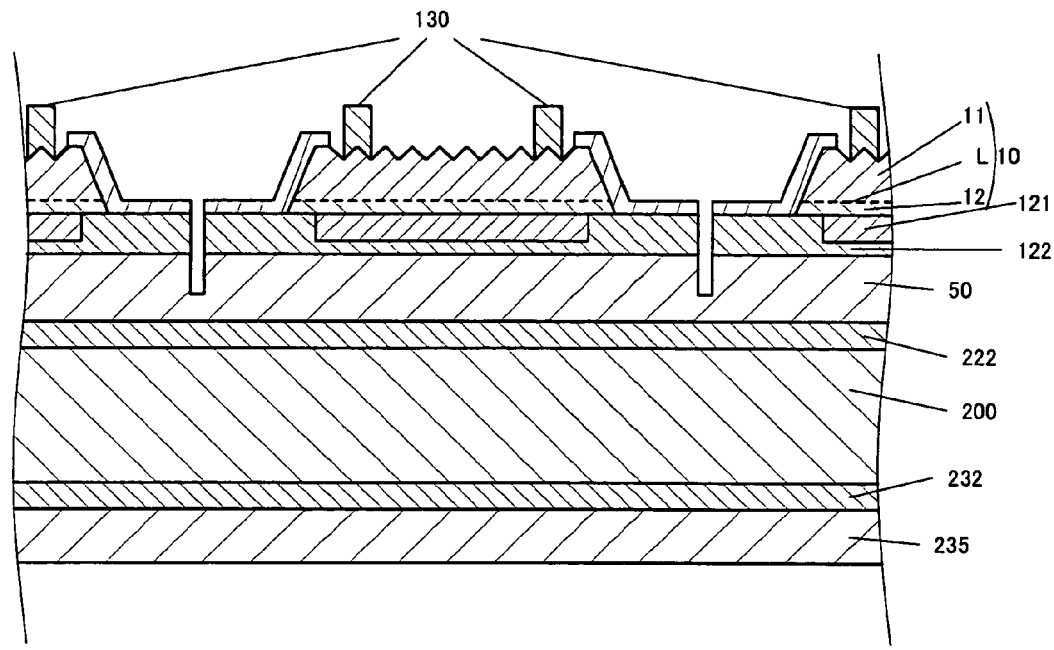
Fig. 2.S
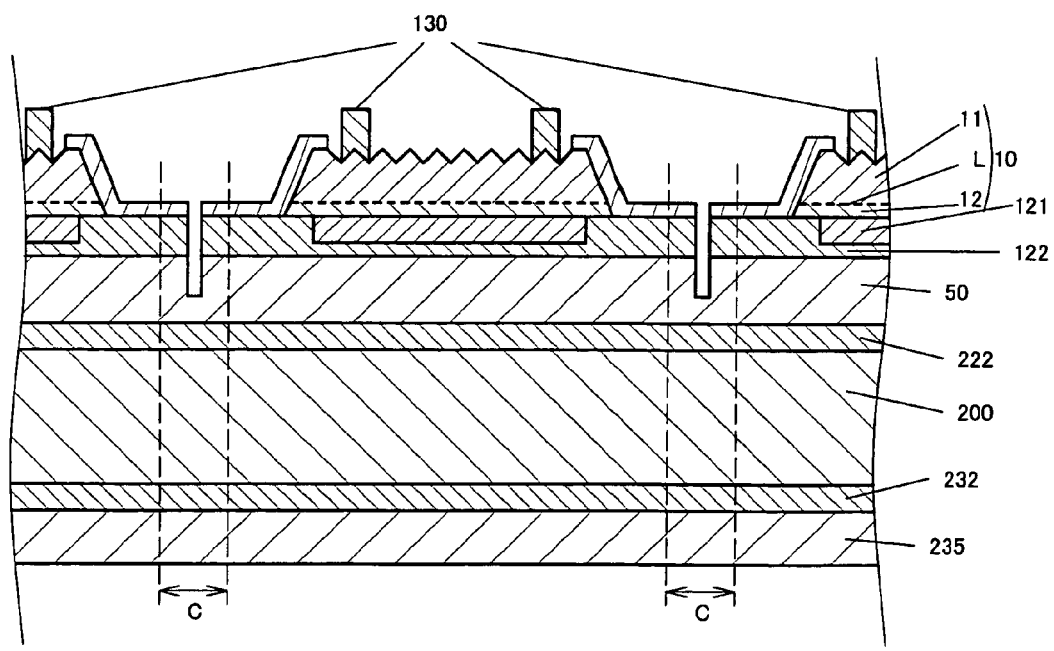

Fig. 3.A
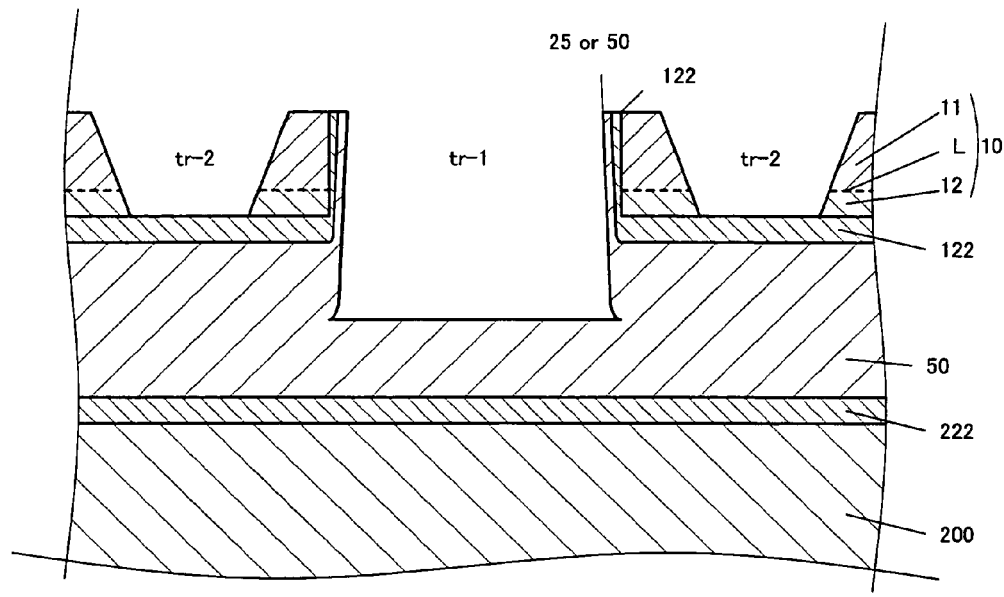
Fig. 3.B
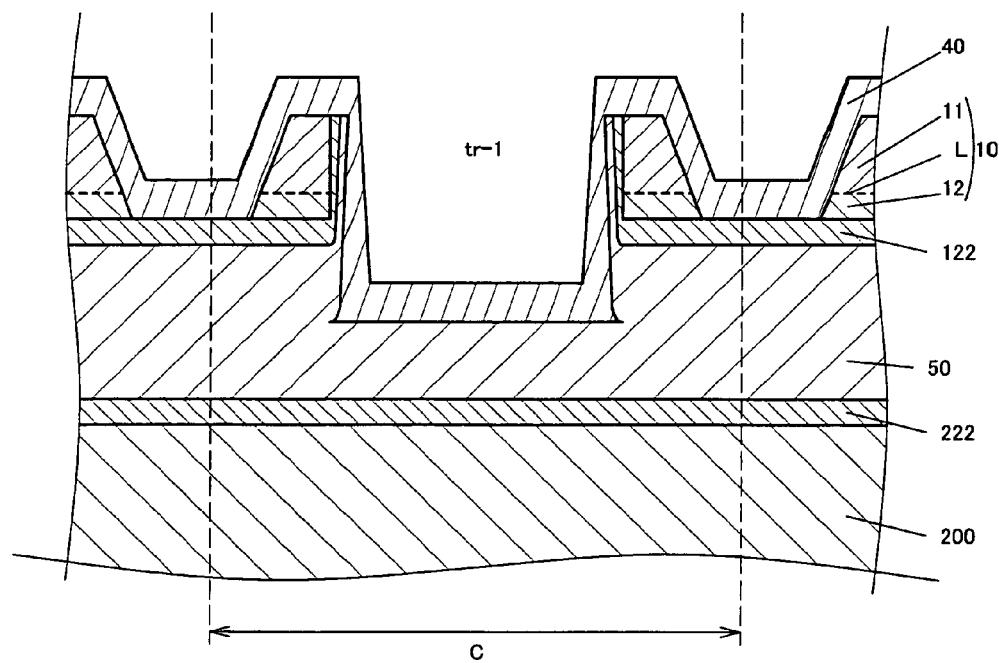

Fig. 5.A
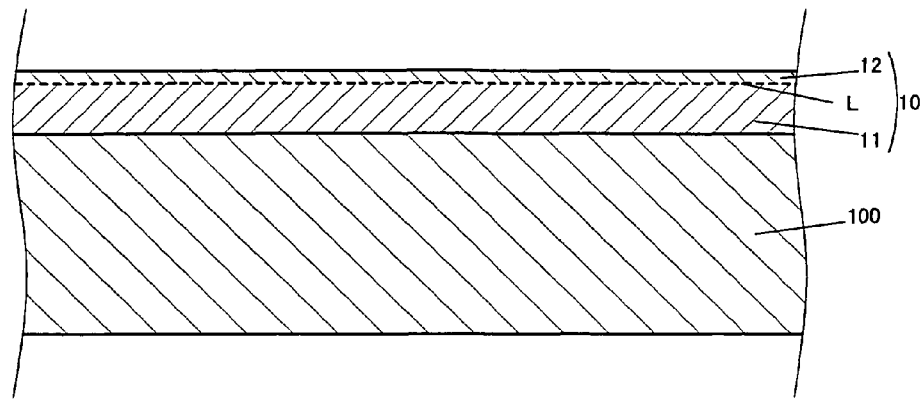
Fig. 5.B
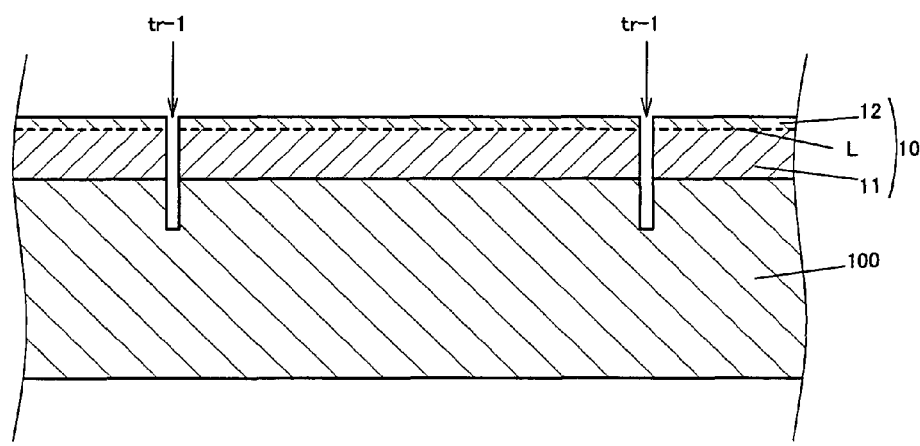
Fig. 5.C
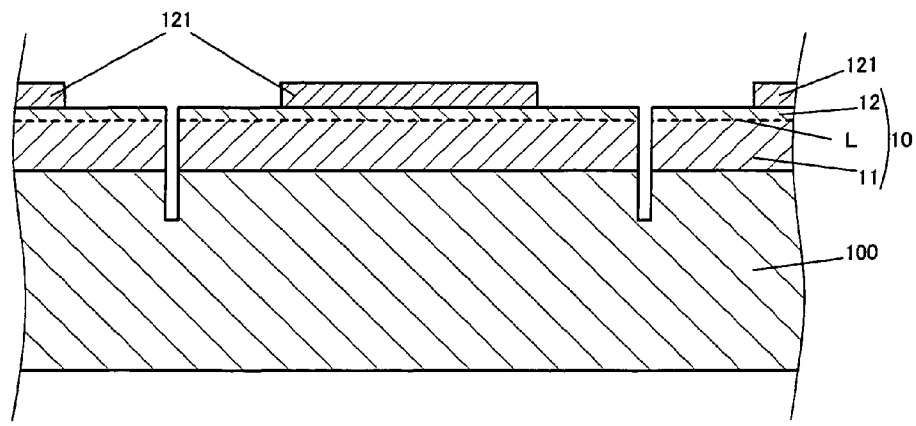

Fig. 5.D
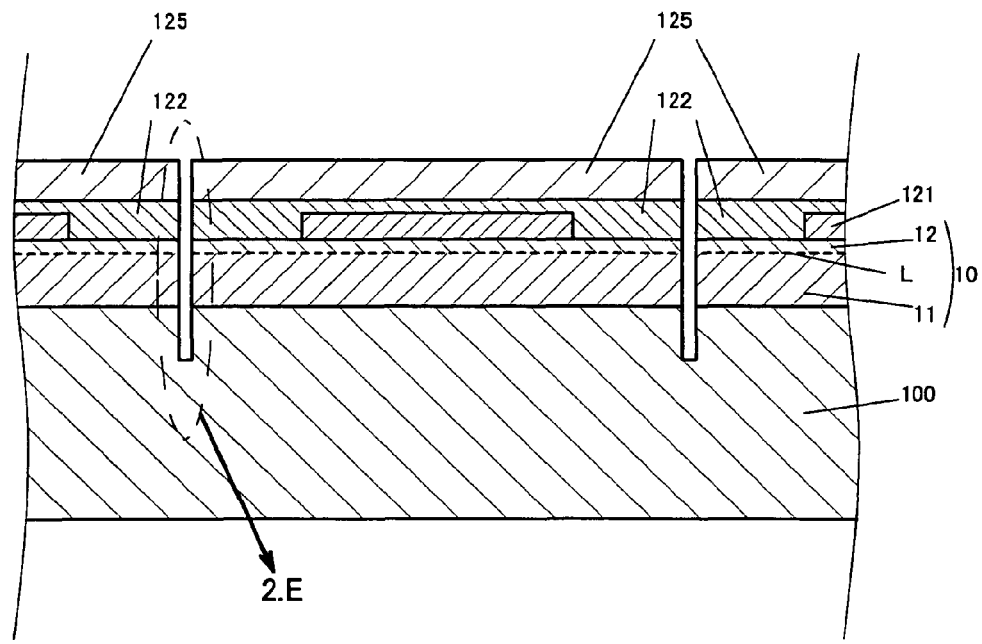
Fig. 5.E
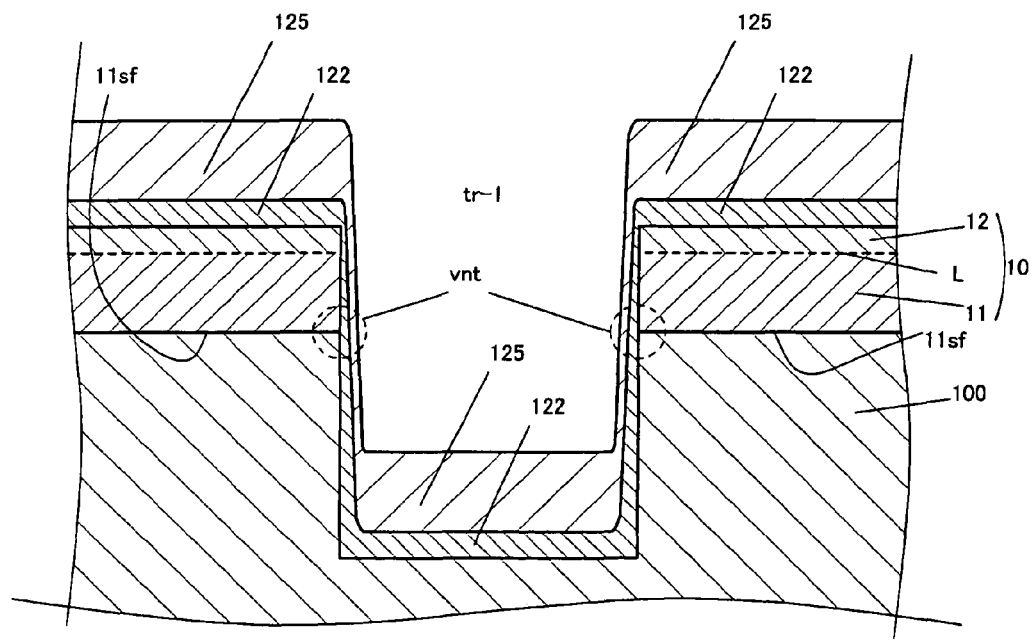

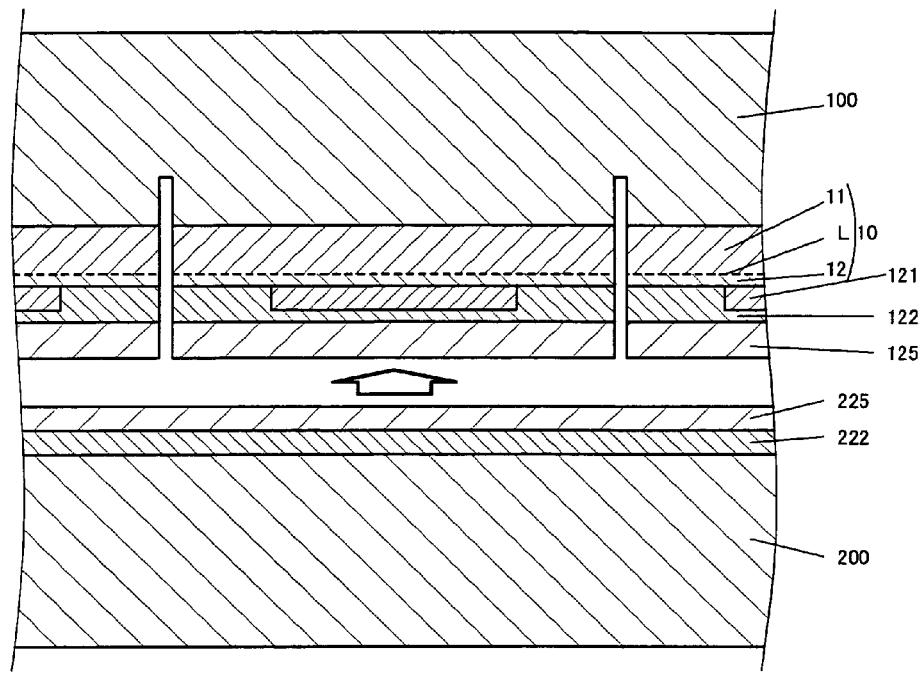
Fig. 5.F
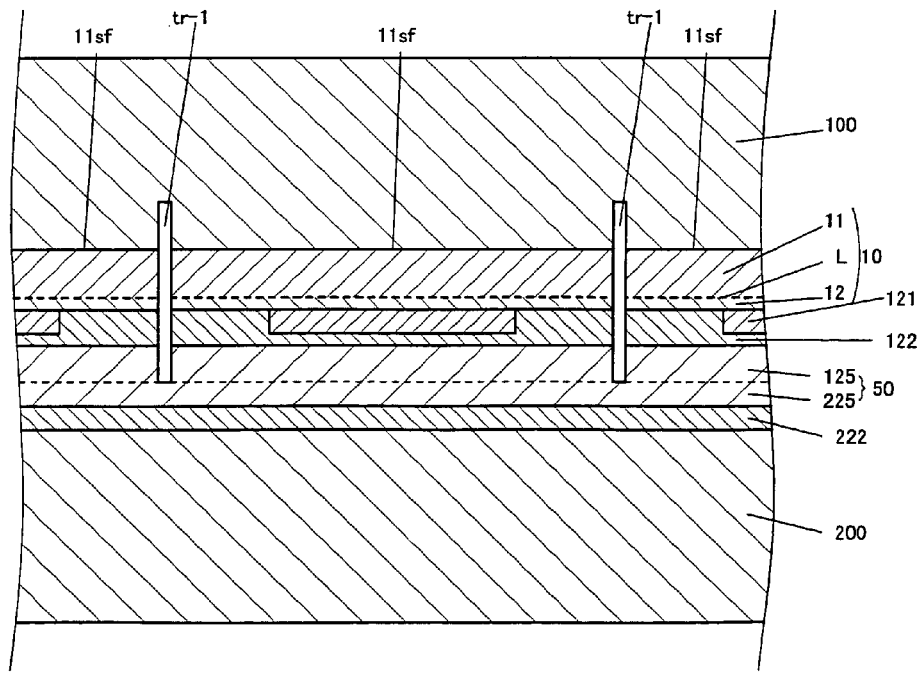
Fig. 5.G

Fig. 5.H
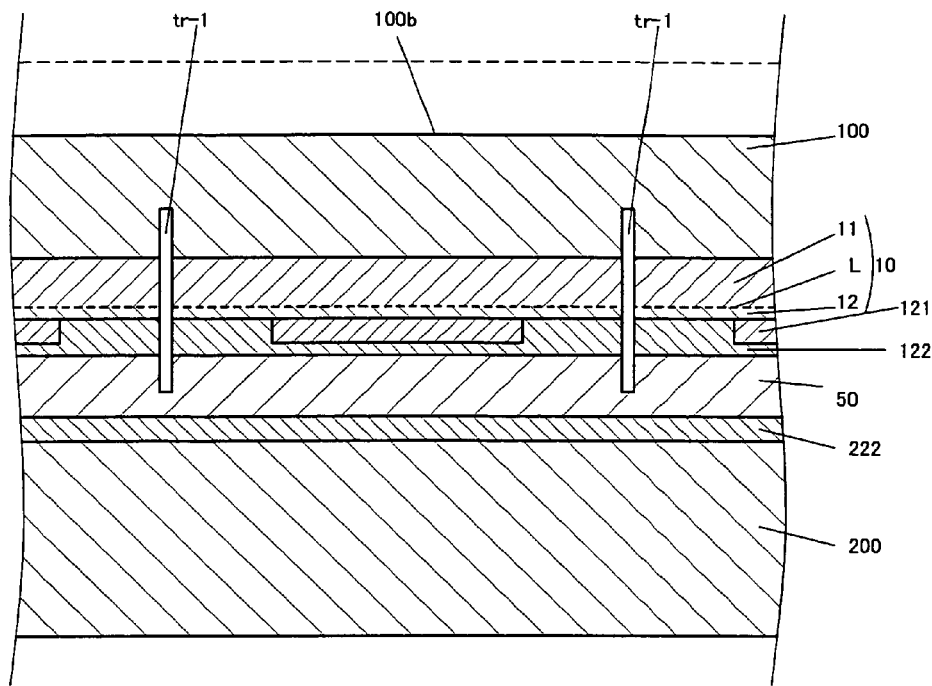
Fig. 5.I
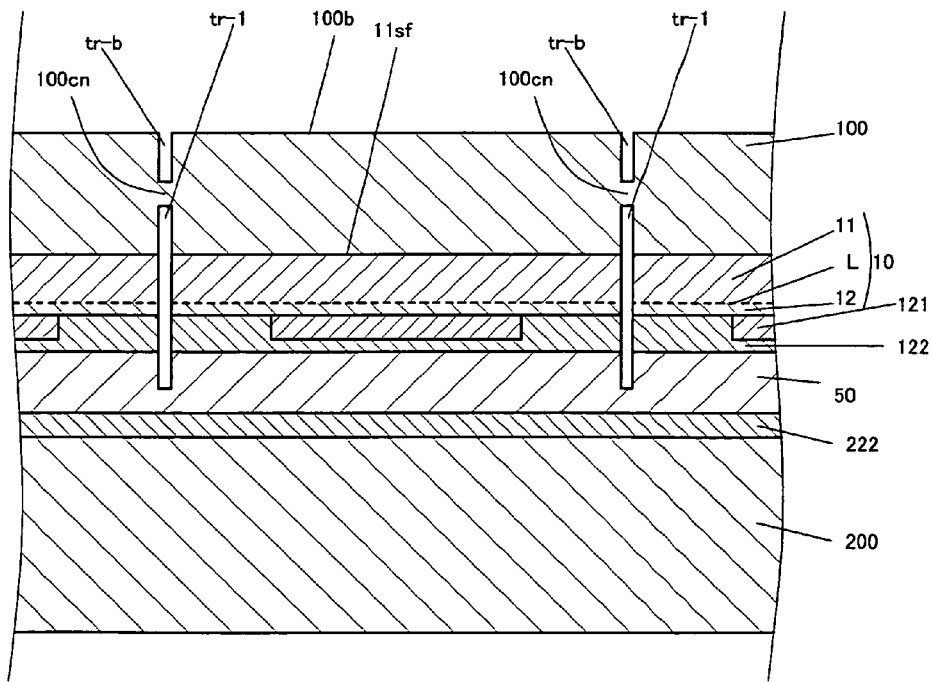

Fig. 5.J
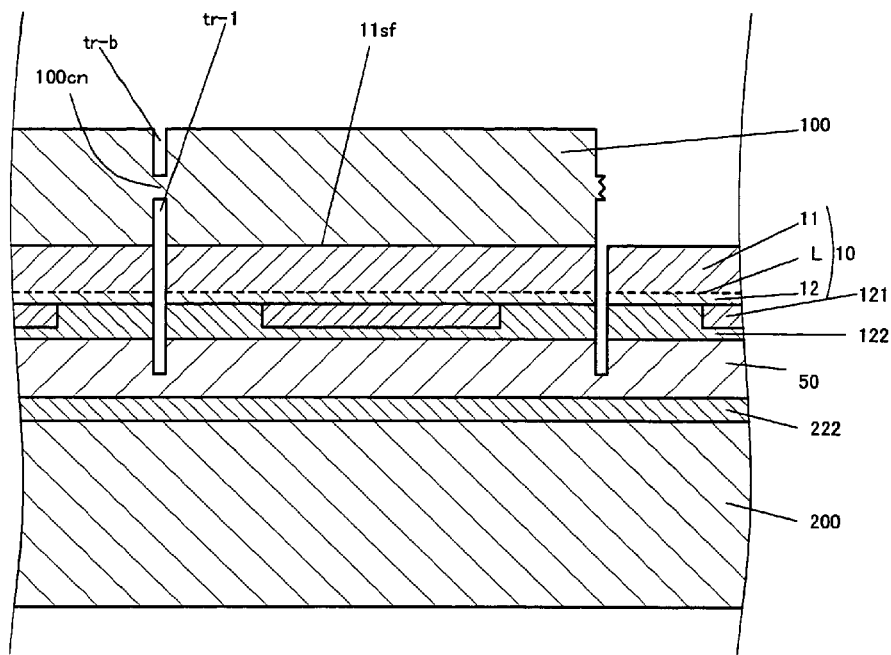
Fig. 5.K
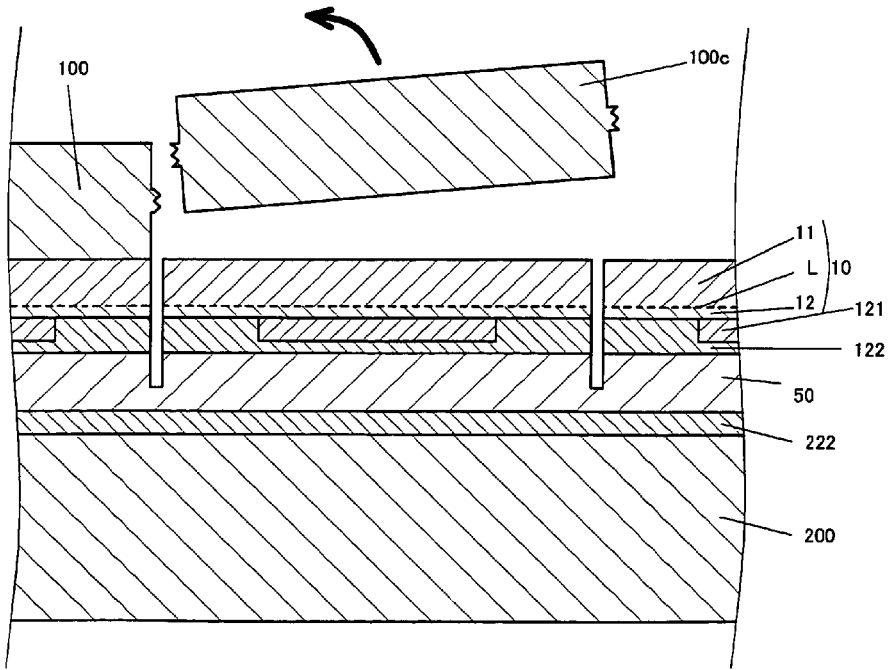

Fig. 5.L
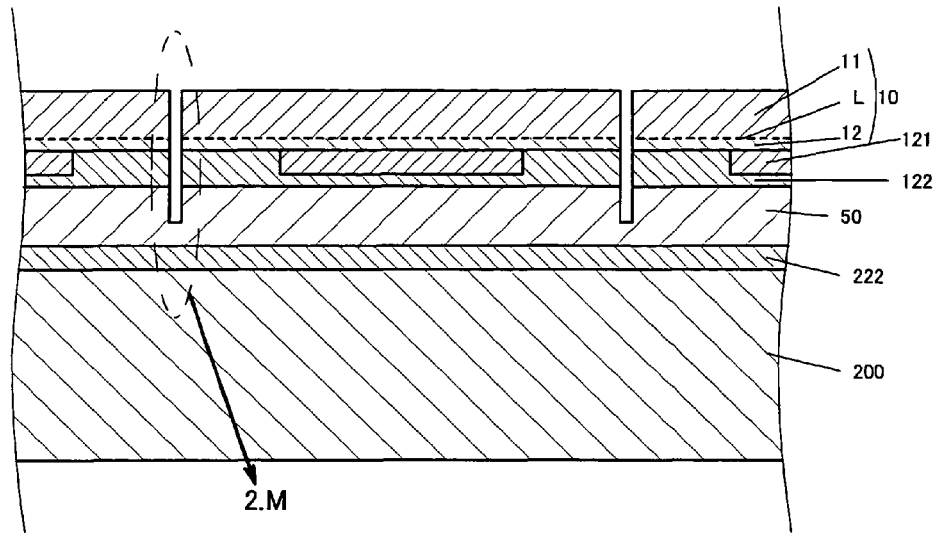
Fig. 5.M
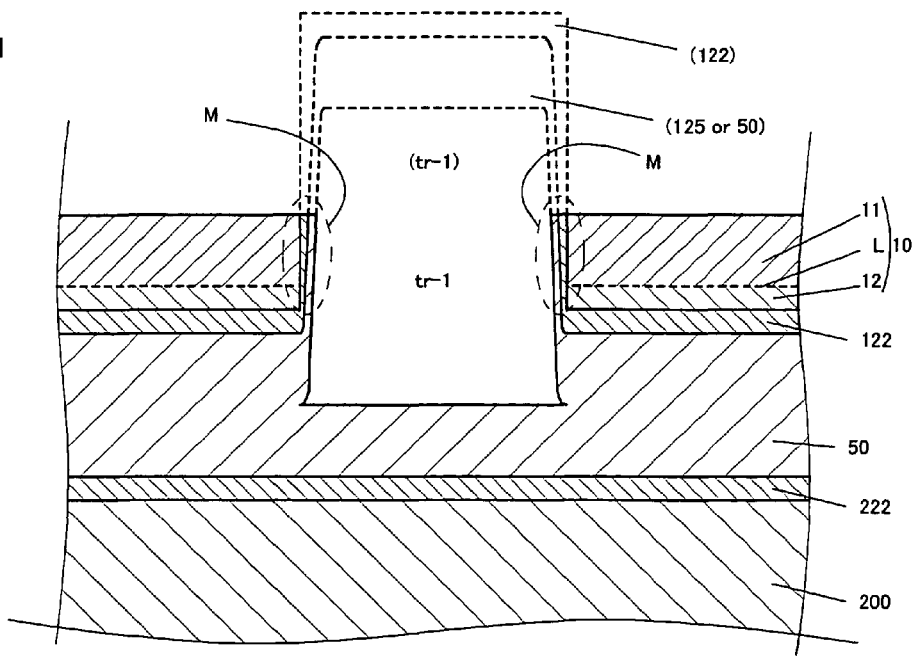

Fig. 5.N
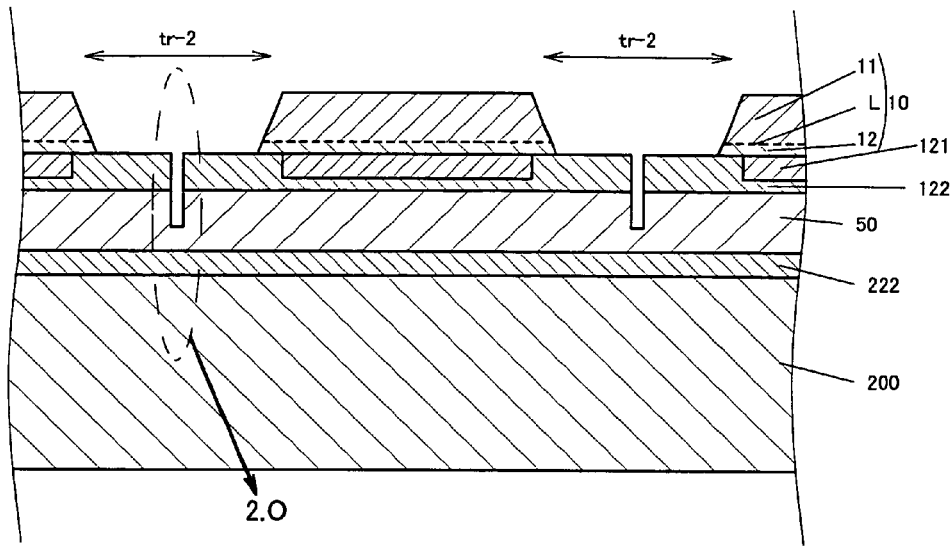
Fig. 5.O
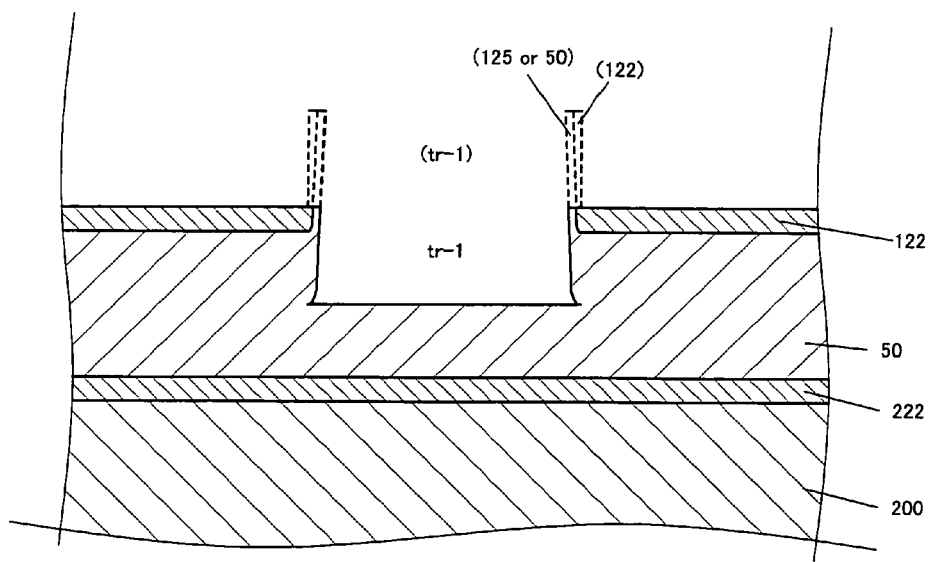

Fig. 5.P
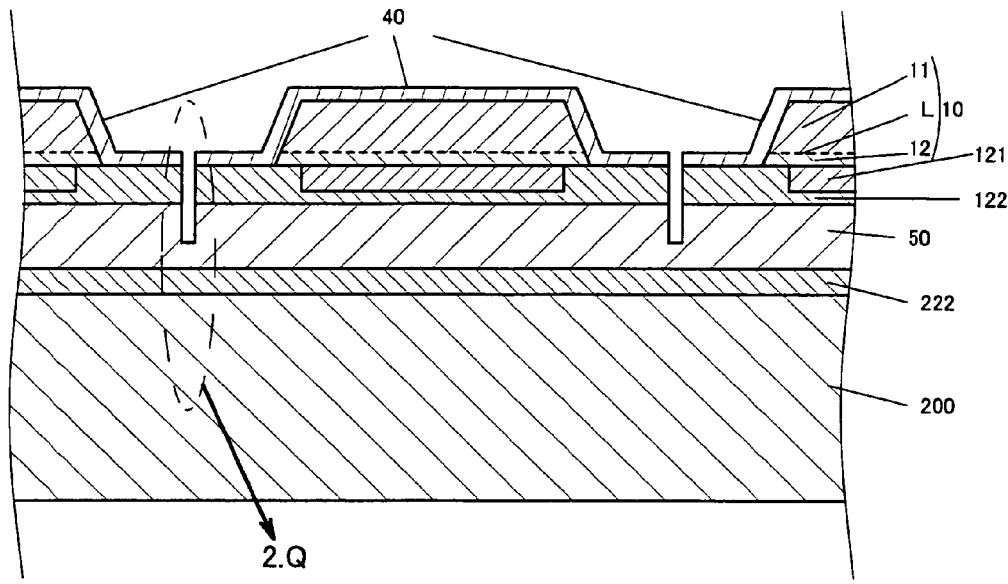
Fig. 5.Q
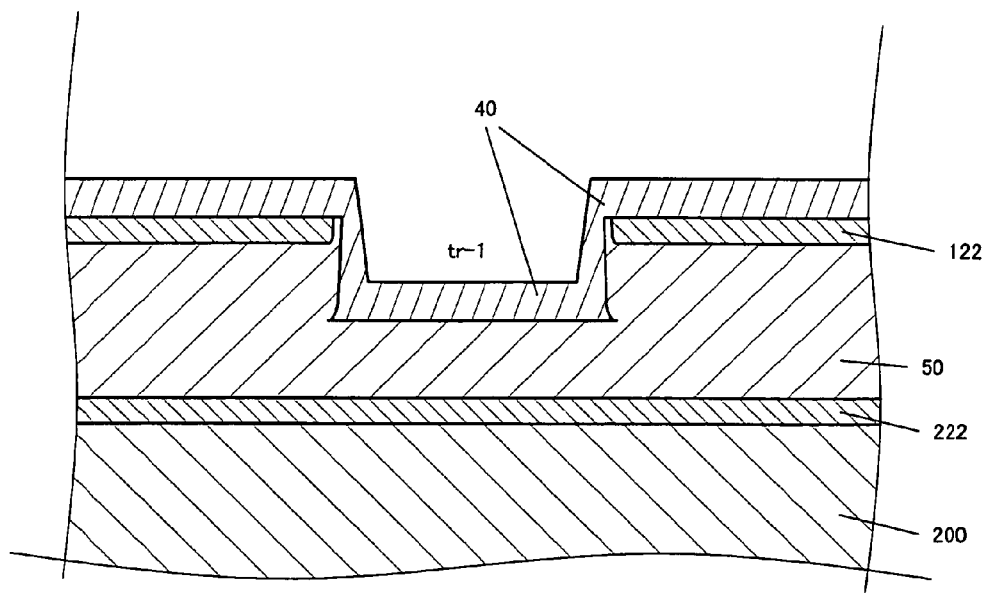

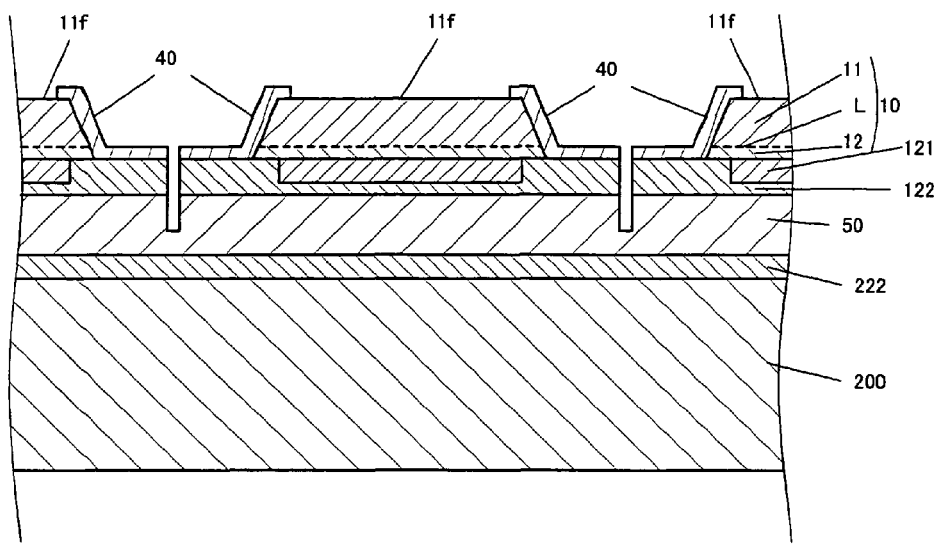
Fig. 5.R
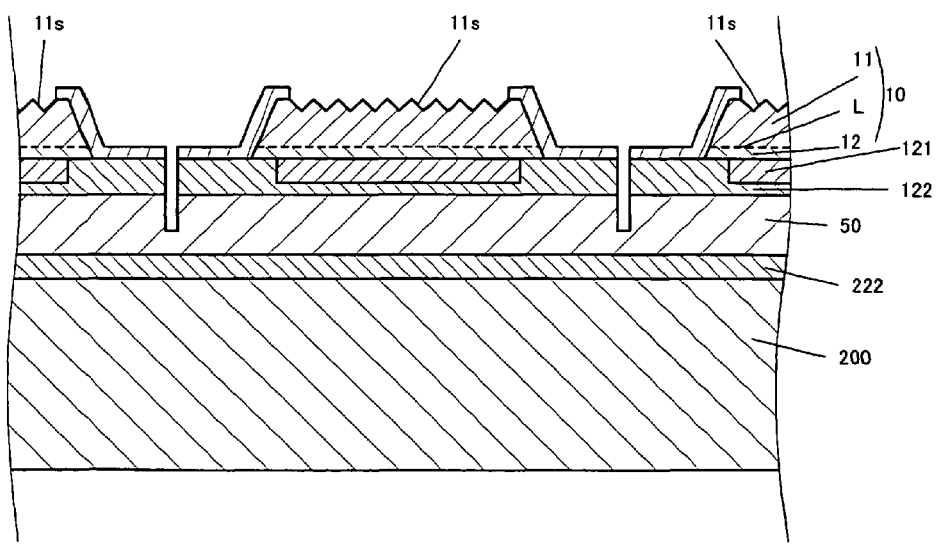
Fig. 5.S

Fig. 5.T
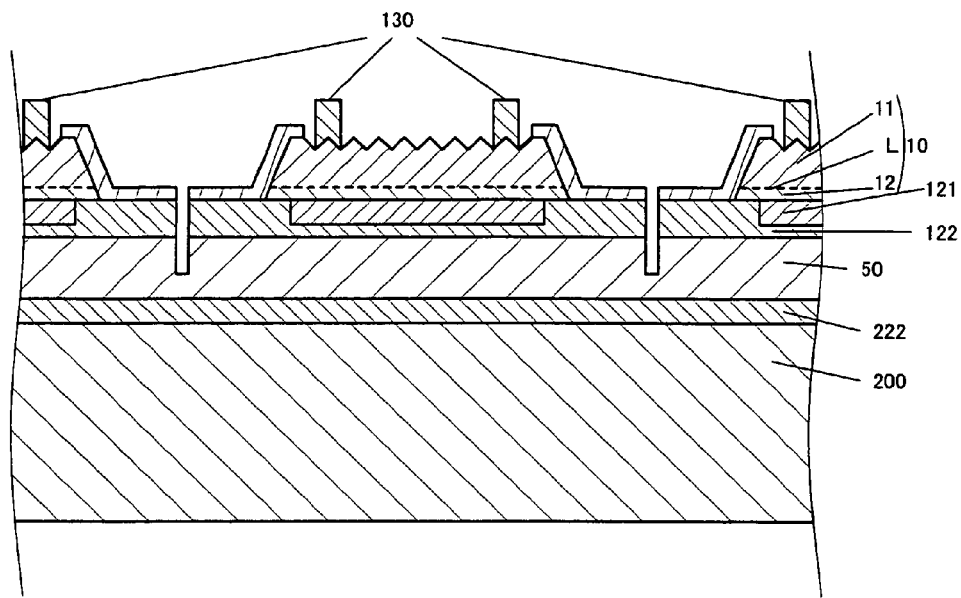
Fig. 5.U
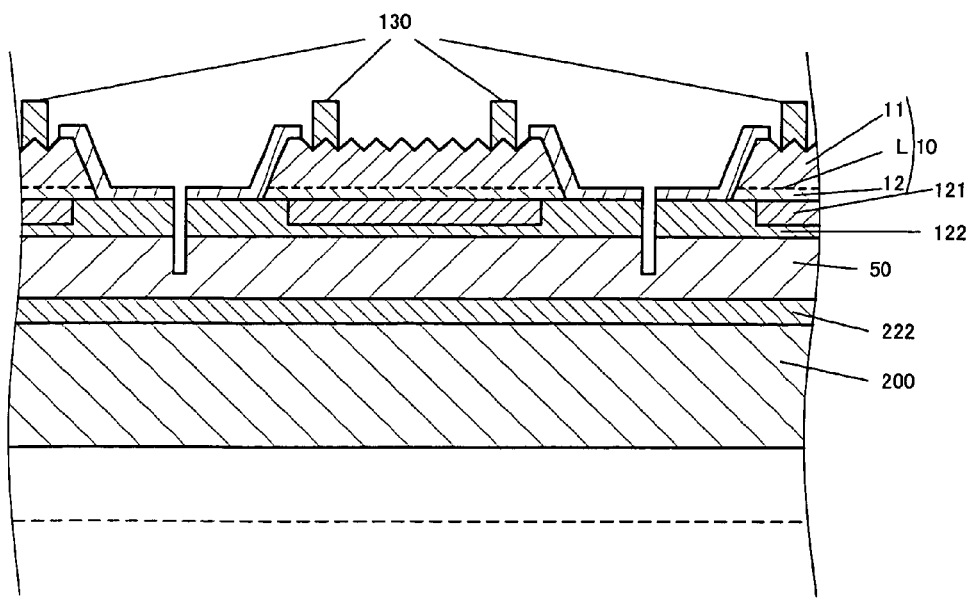

Fig. 5.V
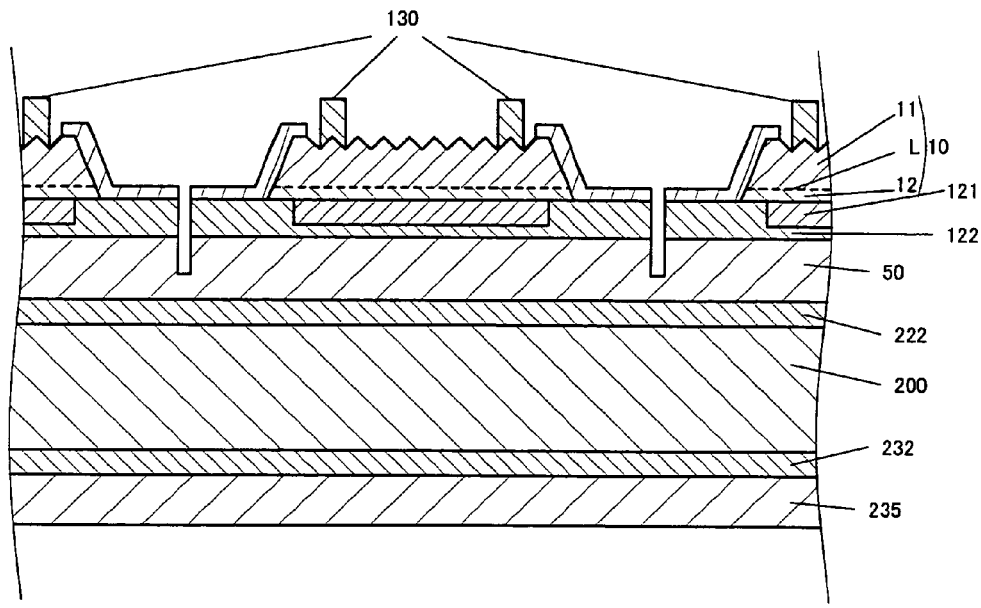
Fig. 5.W
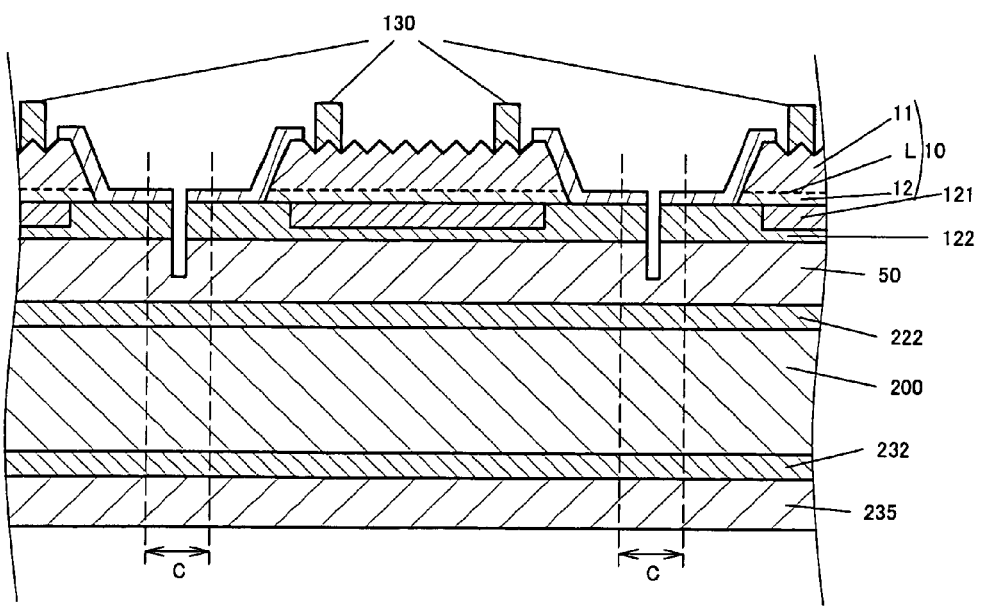

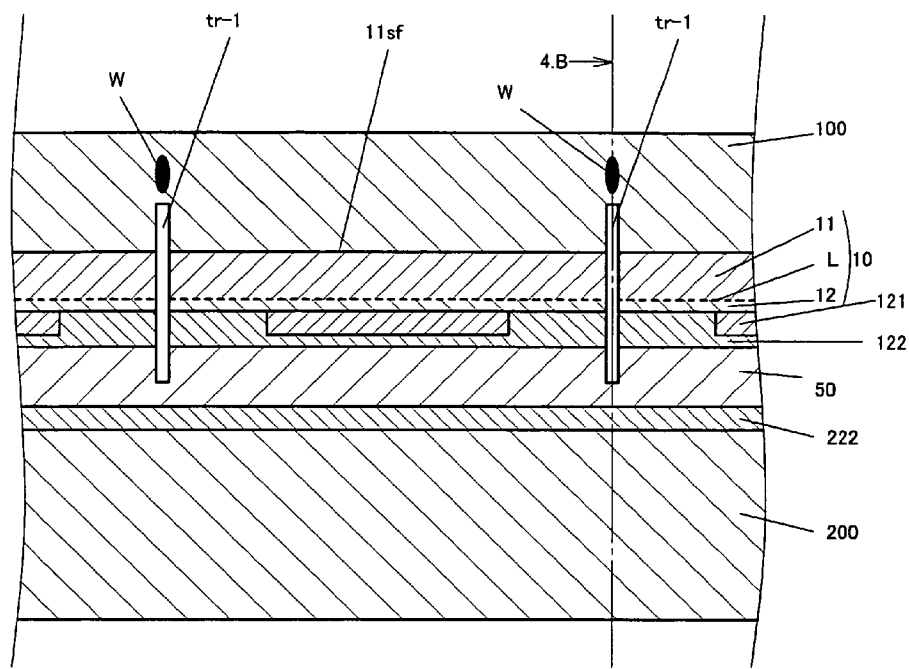
Fig. 6.A
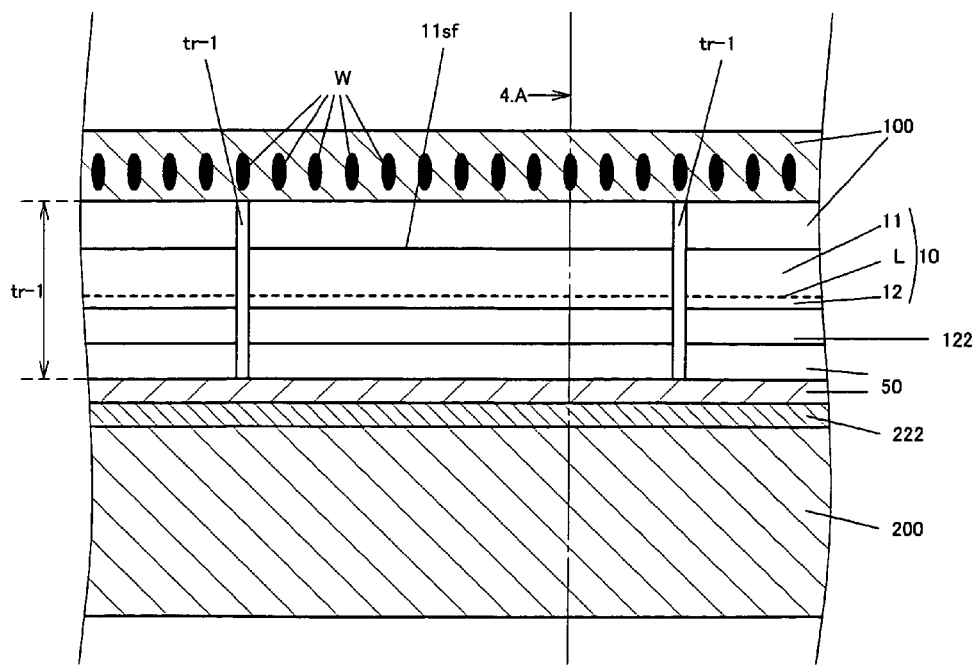
Fig. 6.B

Fig. 7.A
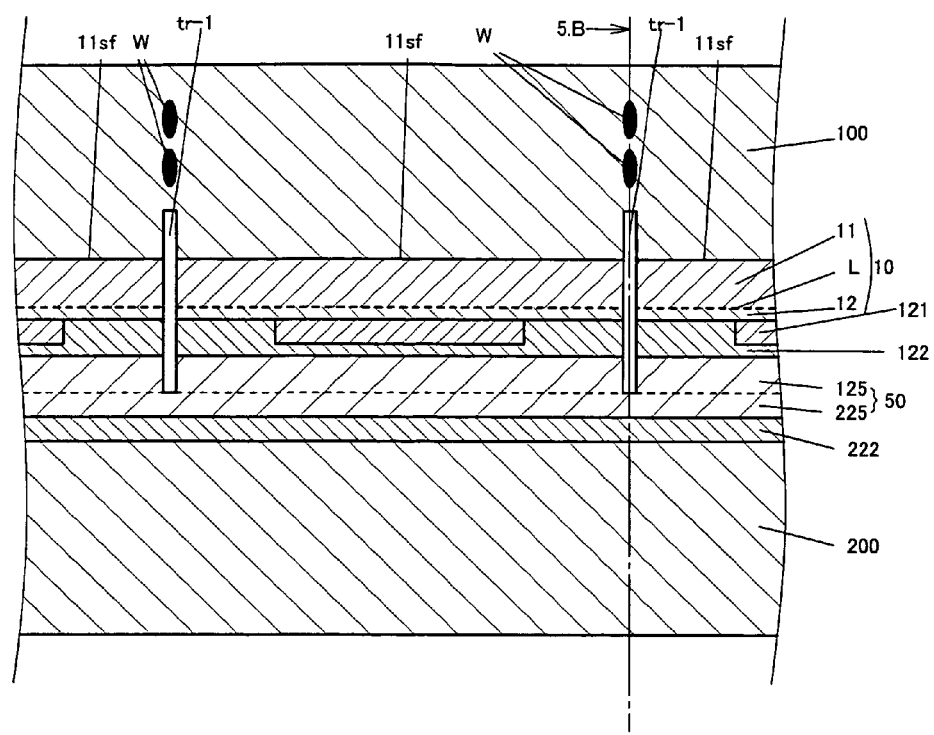
Fig. 7.B
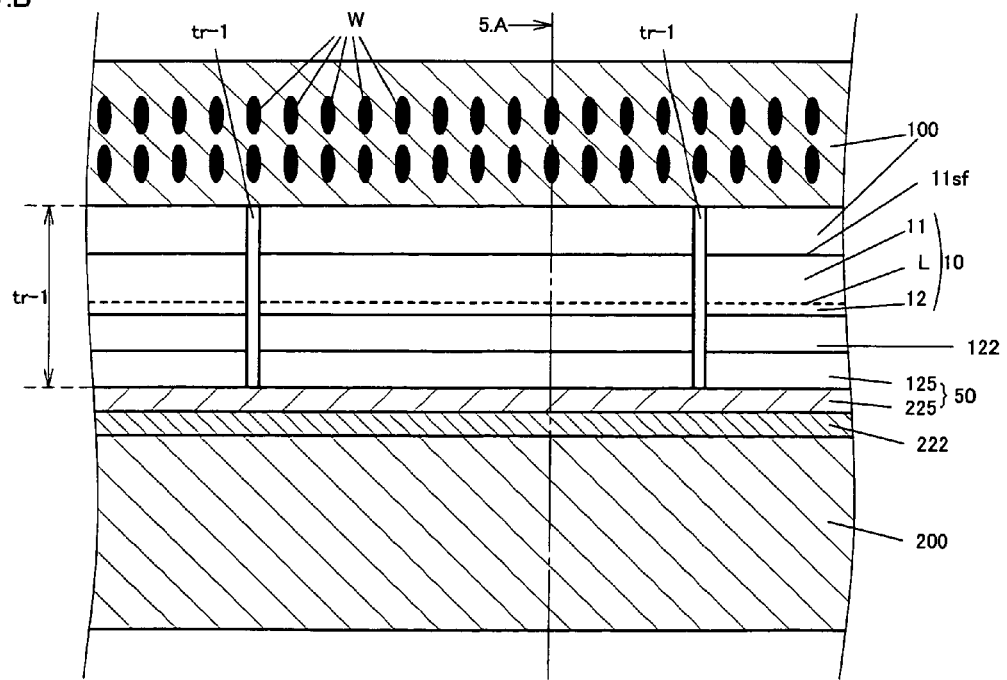

Fig. 8.A
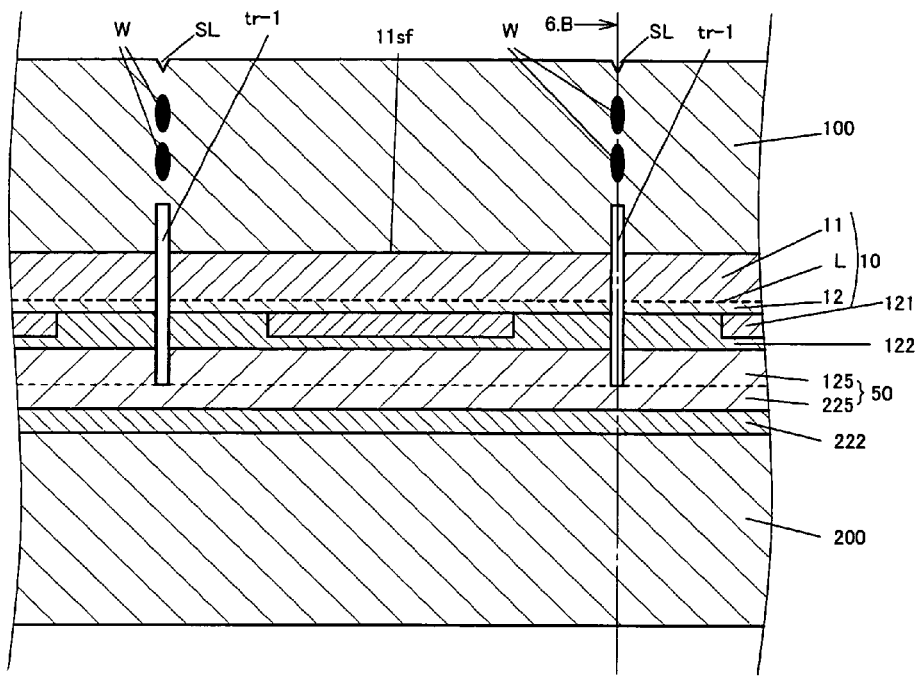
Fig. 8.B
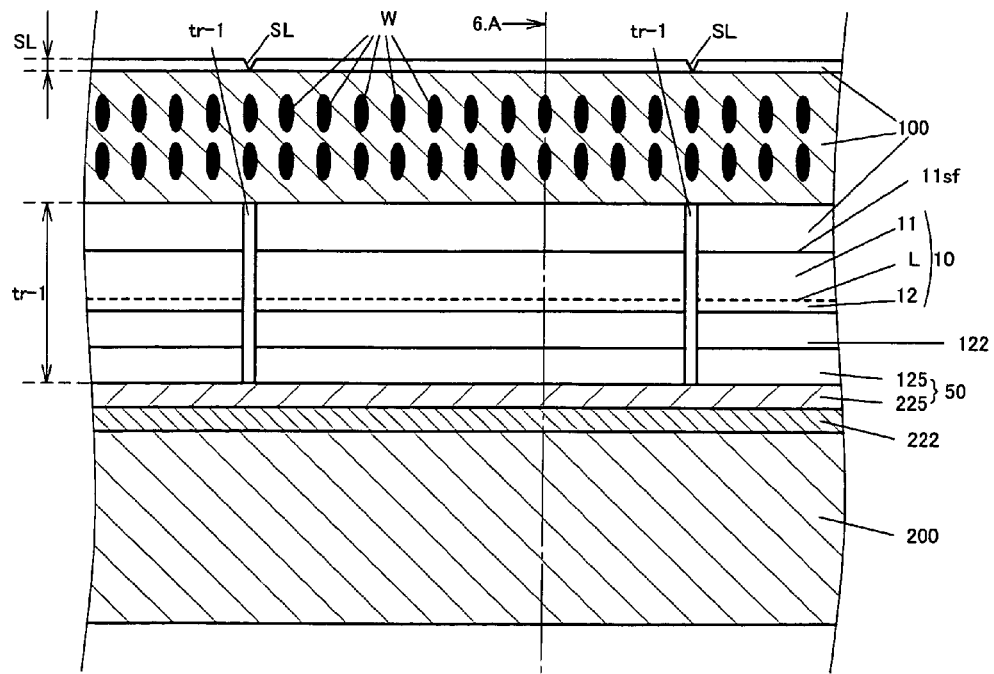

ized. When the gallium nitride GaN layer is decomposed successively from the outer periphery of a wafer in which the epitaxial growth substrate 100 and the supporting substrate 200 have been joined to each other, molten metal gallium (Ga) and nitrogen (N$_2$) gas generated by decomposition can be discharged to the outside from the outer periphery of the wafer.

METHOD FOR PRODUCING GROUP III NITRIDE COMPOUND SEMICONDUCTOR ELEMENT

BACKGROUND OF THE INVENTION

1. Field of the Invention

The present invention relates to a method for producing a Group III nitride compound semiconductor element. The invention relates to a laser lift-off technique involving epitaxially growing a Group III nitride compound semiconductor on a different kind of substrate to form an element structure, adhering a conductive supporting substrate to the top layer of the element structure through a metal or a solder or other conductive layer, and then decomposing a thin layer of the Group III nitride compound semiconductor in the vicinity of the interface with the different kind of substrate by laser irradiation to remove the different kind of substrate. The invention is particularly effective in a method for producing a Group III nitride compound semiconductor light emitting element having pn junction or having a p type layer and an n type layer one above the other with an active layer interposed therebetween.

2. Description of the Related Art

The laser lift-off technique that has been introduced first by Kelly et al. described as Non-patent Document 1 (Appl. Phys. Lett., vol 69, 1996, pp. 1749-1751) has enabled a light emitting element or a Group III nitride compound semiconductor element to re-adhere to a conductive supporting substrate from the substrate for use in epitaxial growth. This enables to provide an electrode on the rear surface of the supporting substrate in a light emitting diode. Thus, a light emitting element having positive and negative counter electrodes at two portions of the rear surface of the substrate and the top surface of the epitaxial layer similarly as a GaAs light emitting element can be obtained. Advantages obtained by providing positive and negative electrodes in such a manner as to face with each other with a light emitting layer interposed therebetween reside in that a light emitting area approximately equal to the level area of the supporting substrate can be formed and uniform light emission can be achieved, whereby light extraction efficiency per element can be increased.

FIGS. 9 and 10 are two flow charts (cross sectional views) briefly illustrating two different techniques that have been published at present. For example, an element in which an n type layer 11 and a p type layer 12 are formed in order using a different kind of substrate, such as a sapphire substrate, as an epitaxial growth substrate 100 as illustrated in FIG. 9 is taken as an example. In this description, a laminate in which the n type layer 11 and the p type layer 12 are provided, and a light emitting region L is formed among therebetween is referred to as an epitaxial layer 10. In this description, the element in which the n type layer 11 and the p type layer 12 are provided, and the light emitting region L is formed among therebetween is mentioned, but it is a matter of course that the structure of the light emitting element is not limited to such a simple structure.

On the epitaxial growth substrate 100, the n type layer 11 and the p type layer 12 are formed in order. On the p type layer 12, a contact electrode 121 and a metal or other conductive layer 122 are formed. Separately, a metal or other conductive layer 222 is formed on the surface of a conductive supporting substrate 200 containing silicon or the like. Next, on the surface of the conductive layer 122 and the surface of the conductive layer 222, a solder layer 50 is formed. Then, through the solder layers, the epitaxial growth substrate 100 on which the n type layer 11 and the p type layer 12 have been formed and the conductive supporting substrate 200 are adhered to each other. Thereafter, laser LSR is emitted to each chip, for example.

Thus, for example, the interface of a gallium nitride GaN layer facing a sapphire substrate through an aluminum nitride buffer is decomposed into a thin film, and then separated into molten metal gallium (Ga) and nitrogen (N$_2$) gas. When the gallium nitride GaN layer is decomposed successively from the outer periphery of a wafer in which the epitaxial growth substrate 100 and the supporting substrate 200 have been joined to each other, molten metal gallium (Ga) and nitrogen (N$_2$) gas generated by decomposition can be discharged to the outside from the outer periphery of the wafer.

FIG. 10 illustrates a technique of providing an air vent tr communicating with the outside on the outer periphery of the wafer so as to further facilitate discharge of the molten metal gallium (Ga) and nitrogen (N$_2$) gas generated by decomposition. The air vent tr is formed by dry etching using a resist mask from the side of the p type layer 12 of the epitaxial layer before joining of the epitaxial growth substrate 100 and the supporting base 200 having the epitaxial layer 10. In this case, dry etching using a resist mask is carried out from the side of the p type layer 12, resulting in that the side surfaces of the etched outer periphery of the epitaxial layer have a taper (inclination). With respect to the taper (inclination), the horizontal cross section area of the p type layer 12 is the smallest, and the horizontal area of the light emitting region L and the n type layer 11 becomes larger in order toward the light emitting region L and the n type layer 11. In general, in the dry etching of the Group III nitride compound semiconductor using a resist mask, the taper (inclination) forms an angle of 60 to 80° with the horizontal plane. More specifically, in FIG. 10, when separated into each light emitting element chip, a reverse-tapered element in which the horizontal cross section area of the n type layer 11 which is an upper portion is larger than the horizontal cross section area of the p type layer 12 which is a lower portion is obtained.

The side surfaces of the p type layer 12 and the n type layer 11 are exposed by dry etching. Thus, in order to avoid short circuit between the layers, it is necessary to cover the side surfaces of the p type layer and the n type layer 11 with an insulating protective film 40. In order to secure the adhesiveness of the insulating protective film 40, the p type layer 12, and the n type layer 11, it is necessary to use a substance having a high adhesiveness with the insulating protective film 40 for the conductive layers 122 and 123. In FIG. 10, the conductive layers 122 and 123 and the solder layer 125 are formed in such a manner as not to block the air vent tr.

As prior arts of the invention, publications of the prior applications by the present applicant are mentioned as Patent Document 1 (Japanese Unexamined Patent Application Publication No. 2008-186959) and Patent Document 2 (Japanese Unexamined Patent Application Publication No. 2005-109432).

SUMMARY OF THE INVENTION

At present, even when an attempt of producing a light emitting element by the laser lift-off technique has been made, the yield is extremely poor. In actual, according to the method of FIG. 9, GaN is decomposed to generate liquid Ga and nitrogen gas in a laser irradiated area at the interface with the sapphire substrate of the GaN layer, causing extremely great volume expansion in the decomposed area. When there is no escape for the nitrogen gas, a layer may be separated at any position of the laminated structure. In order to form an escape for the nitrogen gas in the periphery of a wafer, it is considered to decompose GaN at the interface between the sapphire substrate and the GaN layer successively from the outer periphery of the joined wafer, for example. However, non-laser irradiated areas are continuously adjacent to the laser irradiated area, and high load stress is applied to the vicinity of the boundary between the laser irradiated area and the non-laser irradiated area. Therefore, in the vicinity of the boundary between the laser irradiated area and the non-laser irradiated area adjacent to the area, a layer is separated at the interface of any layer of a laminate having low adhesiveness, and moreover cracks occur in a silicon substrate or the like serving as the supporting substrate.

In the method of FIG. 10, when the conductive layers 122 and 123 are formed for electrical connection to the p type layer 12 from the supporting substrate 200 on the outer peripheral side surface of the element, the conductive layers 122 and 123 may contact the n type layer 11 of the epitaxial layer 10 in the following process. In this case, the p electrode and the n electrode are short circuited not through the light emitting layer or the like, and thus the element is rejected as an element. More specifically, the yield is worsened. Therefore, it is not preferable to form the conductive layers 122 and 123 in the vicinity of the side surfaces of the epitaxial layer serving as the outer periphery of each element.

Thus, in order to avoid short circuit between the p layer and the n layer on the side surfaces thereof, it is necessary not to form the conductive layers 122 and 123 and the solder layer 225 on the insulating protective film 40 formed on the side surfaces of the epitaxial layer 10 on the outer periphery of each element. However, in order to achieve the above, a lift-off process using a resist mask is required. More specifically, it is necessary to repeat application of a resist material, exposure to light, patterning by a development process, vapor deposition of metal or the like, and a lift-off process of the resist. In this case, when a residual resist and contaminants adhere to the side surfaces of each element, the adhesiveness between each layer deteriorates, causing separation of a layer or cracks arise during laser lift-off.

The technique of Patent Document 1 by the present applicant has a feature in that the epitaxial layer 10 is separated in each element, and then resin is thickly deposited only on the periphery of each element without covering a metal electrode, such as the contact electrode 121 or the conductive layer 122. However, it is not always easy to deposit resin only on the periphery of each element without covering the metal electrode, and thus a method in place of the technique using resin is desired.

The present invention has been made in order to solve the above described problems. It is an object of the invention to increase the yield of obtaining favorable element characteristics when a Group III nitride compound semiconductor element is formed using a laser lift-off technique.

The present inventors have conducted researches on improvement of each process of the laser lift-off technique described above. Then, the present inventors have found that the sapphire substrate can be separated into fragments by each laser irradiation of one section corresponding to one to a plurality of adjacent elements. It is an object of the invention to further increase the yield of obtaining favorable element characteristics based on the finding.

According to a first aspect of the invention, a method for producing a Group III nitride compound semiconductor element includes growing an epitaxial layer containing a Group III nitride compound semiconductor using a different kind of substrate as an epitaxial growth substrate, adhering a supporting substrate to the top surface of the epitaxial growth layer through a conductive layer, and then removing the epitaxial growth substrate by laser lift-off, in which the method for producing a Group III nitride compound semiconductor element includes:

a first groove formation process of forming, before adhesion of the epitaxial layer and the supporting substrate, a first groove that at least reaches an interface between the bottom surface of the epitaxial layer and the epitaxial growth substrate from the top surface of the epitaxial layer formed on the epitaxial growth substrate and acts as an air vent communicating with the outside of a wafer when the epitaxial layer and the supporting substrate are joined to each other;

a second groove formation process of forming a second groove for removing the epitaxial layer of the outer periphery of each chip and separating the epitaxial layer into each chip after separating the epitaxial growth substrate by laser lift-off;

an insulating protective film formation process of forming an insulating protective film that completely covers at least the outer peripheral side surface of the epitaxial layer of each chip exposed in the second groove formation process; and a supporting substrate cutting process of cutting the supporting substrate for separating into each chip.

A feature of the invention resides in that the first groove serving as an air vent for facilitating the removal of nitrogen gas and molten Group III elements generated when the Group III nitride compound semiconductor layer is decomposed into a thin layer by laser irradiation for laser lift-off and the second groove for forming the outer periphery of the epitaxial layer of an element chip to be finally obtained are not the same. As described later, the structure of the first groove may be removed during formation of the second groove or in the cutting process of the supporting substrate.

A second aspect of the invention has a feature of forming a contact electrode on the top surface of the epitaxial layer after the first groove formation process.

A third aspect of the invention has a feature of forming at least one conductive layer, which is formed on the epitaxial growth substrate and covers the contact electrode, on the entire surface of the wafer before the epitaxial layer formed on the epitaxial growth substrate is joined to the supporting substrate in the second aspect.

A fourth aspect of the invention has a feature of carrying out the first groove formation process by a dicer in any one of the first to third aspects.

A fifth aspect of the invention has a feature of carrying out the first groove formation process by dry etching in any one of the first to third aspects.

A sixth aspect of the invention has a feature of carrying out the first groove formation process by decomposition of the epitaxial layer by laser irradiation in any one of the first to third aspects.

A seventh aspect of the invention has a feature of carrying out the second groove formation process by dry etching in any one of the first to sixth aspects.

An eighth aspect of the invention has a feature of also removing the epitaxial layer constituting the side surfaces of the first groove in the second groove formation process in any one of the first to seventh aspects.

A ninth aspect of the invention has a feature of forming a mask covering the first groove so as not to break the structure of the first groove, and then removing the structure forming the first groove in the supporting substrate cutting process in the second groove formation process in any one of the first to seventh aspects.

A tenth aspect of the invention has a feature in that the supporting substrate cutting process is carried out by laser irradiation in any one of the first to ninth aspects.

An eleventh aspect of the invention is a method for producing a Group III nitride compound semiconductor element having a feature of including a substrate processing process of subjecting, to physical processing, the rear surface or the inside of the epitaxial growth substrate, which is a position facing the first groove formed on the front surface of the epitaxial growth substrate, after the supporting substrate is adhered to the epitaxial growth substrate on which the epitaxial layer has been formed in the first to tenth aspects of the invention.

Features of the invention reside in the following respects. During the laser irradiation for laser lift-off, the Group III nitride compound semiconductor layer is decomposed in the vicinity of the interface in contact with the epitaxial growth substrate. For example, hot nitrogen gas and liquid or partially vaporized gallium generating at this time pushes up the laser irradiated area of the epitaxial growth substrate, whereby the epitaxial growth substrate is fragmented and flown away. In the invention, the position facing the first groove of the epitaxial growth substrate is physically processed. The physical processing refers to forming a shallow scribe line or rear surface groove at the position facing the first groove on the rear surface of the epitaxial growth substrate or forming a laser modified portion in the epitaxial growth substrate. By this physical processing, cracks occur on the epitaxial growth substrate between the first groove and the physically processed portions thereof during laser lift-off, whereby the epitaxial growth substrate is easily fragmented and flown away for each laser irradiated area. It is preferable to form the first groove before vapor depositing a low melting point metal layer for joining to the supporting substrate on the epitaxial growth substrate.

A twelfth aspect of the invention has a feature in that the substrate processing process is a scribe line formation process of forming a scribe line having a depth of 20 μm or lower on the rear surface of the epitaxial growth substrate, which is a position facing the first groove formed on the front surface of the epitaxial growth substrate in the eleventh aspect.

A thirteenth aspect of the invention has a feature in that the substrate processing process is a laser modified portion formation process of forming a modified portion by laser irradiation in the epitaxial growth substrate, which is a position facing the first groove formed on the front surface of the epitaxial growth substrate in the eleventh or twelfth aspect.

A fourteenth aspect of the invention has a feature in that the substrate processing process is a rear surface groove formation process of forming a rear surface groove from the rear surface of the epitaxial growth substrate, which is a position facing the first groove formed on the front surface of the epitaxial growth substrate in the eleventh aspect.

A fifteenth aspect of the invention has a feature in that the first groove and the rear surface groove are communicated with each other in the rear surface groove formation process in the fourteenth aspect.

A sixteenth aspect of the invention has a feature in that a remaining portion having a thickness of 100 μm or lower of the epitaxial growth substrate between the first groove and the rear surface groove in the fourteenth aspect. Even when the first groove and the rear surface groove are not communicated with each other, the remaining portion (connecting portion) is broken by gas pressure when the remaining portion (connecting portion) between the first groove and the rear surface groove is very thin, and then the epitaxial growth substrate of the laser irradiated area is fragmented to be easily flown away.

A seventeenth aspect of the invention has a feature of having a thinning process of thinning the epitaxial growth substrate by polishing the same from the rear surface before the substrate processing process and after the supporting substrate is adhered to the epitaxial growth substrate on which the epitaxial layer has been formed.

An eighteenth aspect of the invention has a feature of adjusting the thickness of the epitaxial growth substrate to 5 μm or more to 200 μm or lower by the thinning process in the seventeenth aspect.

A nineteenth aspect of the invention has a feature of mirror finishing the rear surface of the epitaxial growth substrate before the substrate processing process and after the thinning process in the seventh or eighth aspect.

By the first groove formation process, the first grooves that act as an air vent communicating with the outside in the periphery of the wafer in a wafer state where the epitaxial growth substrate on which the epitaxial layer have been formed and the supporting substrate are joined to each other. Thus, a passage through which nitrogen gas generated by decomposition of the Group III nitride compound semiconductor layer upon laser irradiation for laser lift-off is discharged to the outside of the wafer can be secured. Thus, a stress by the generated nitrogen gas can be reduced during the period of time until the connecting portion of a unit section that is the laser irradiated area of the epitaxial growth substrate and the non-irradiated area that is a remaining portion. Therefore, in any area of an area under laser irradiation, a laser irradiated area adjacent to the area, and a non-laser irradiated area, a possibility that separation occurs between the laminated epitaxial layer, the conductive layer, and the supporting substrate becomes low. Also in the laser lift-off process, a possibility that cracks occur in the epitaxial growth substrate or the supporting substrate also becomes low.

As compared with the technique illustrated in FIG. 9, there is no necessity of forming the insulating protective film on the outer peripheral side surface of the epitaxial layer exposed in the first groove formation process during the laser lift-off of the invention. This is because it can be structured so that the side surfaces of the first grooves present during the laser irradiation for the laser lift-off are removed in the following process, and thus the side surfaces of the first grooves do not remain as the outer periphery of a final Group III nitride compound semiconductor element. Therefore, the resist mask which is necessary in forming the insulating protective film is not formed. Moreover, as described later, a conductive layer can be formed on the entire surface of the epitaxial growth substrate having the epitaxial layer in which the first grooves have been formed. More specifically, the formation of a resist mask or other treatments using chemicals become completely unnecessary until laser lift-off is carried out after the formation of the contact electrode. This means that the laser lift-off can be started in a state where the adhesiveness between each layer is strong with no adhesion of a residual resist or contaminants. More specifically, each layer laminated before the laser lift-off does not undergo patterning by photoresist or a chemical treatment process, and thus the adhesiveness between layers does not deteriorate and the separation thereof can be avoided.

Due to the above-described actions, the Group III nitride compound semiconductor element obtained by the invention has little deterioration of element characteristics. More specifically, an extremely high yield can be achieved by the method for producing the Group III nitride compound semiconductor element of the invention.

According to the eleventh aspect of the invention, the vicinity of the interface in contact with the epitaxial growth substrate of the Group III nitride compound semiconductor layers is decomposed by the laser irradiation for laser lift-off. Thus, hot nitrogen gas and liquid or partially vaporized gallium generate between the epitaxial growth substrate and the Group III nitride compound semiconductor layer. Thus, hot nitrogen gas or liquid or partially vaporized gallium pushes up the laser irradiated area of the epitaxial growth substrate. The physically processed portion formed at the position corresponding to each first groove is easily fractured. Thus, the epitaxial growth substrate portion of the laser irradiated area is cut on the line segment connecting the first grooves and the physically processed sections and flown away in the upper direction.

When the first grooves and the rear surface grooves are communicated with each other, the epitaxial growth substrate is divided in each laser irradiated area. In this case, the epitaxial growth substrate portions before laser irradiation are not adjacent to each other in the horizontal direction, and are simply held on the supporting substrate through the Group III nitride compound semiconductor layer and the conductive layer in each section. Therefore, when the III group nitride based compound semiconductor layer that holds each section of the epitaxial growth substrate is decomposed into a thin layer by laser irradiation, the holding of the epitaxial growth substrate portion of the laser irradiated area is released. In this case, the epitaxial growth substrate portion of the laser irradiated area is immediately flown away in the upper direction nitrogen gas of a high temperature generating in an instant.

Even when the first grooves and the rear surface grooves or the scribe lines are not communicated with each other or the first grooves and the laser modified portions are simply formed and the epitaxial growth substrate is not divided in each laser irradiated area, the epitaxial growth substrate is fractured as follows. The boundary portion between the laser irradiated area and the non-laser irradiated area of the epitaxial growth substrate is located on the line segment connecting the first grooves and the physically processed portions facing therewith, e.g., the rear surface grooves, the scribe lines, or the laser modified portions. The strength of the epitaxial growth substrate in this portion is very low compared with other areas. Therefore, a stress of nitrogen gas of a high temperature generating in an instant is applied to the line segment area connecting the first grooves and the physically processed portions, and the epitaxial growth substrate is easily fractured along the line segment area. A measure for holding the epitaxial growth substrate portion of the laser irradiated area is released thus described above, the epitaxial growth substrate portion of the laser irradiated area is immediately flown away in the upper direction by nitrogen gas of a high temperature.

More specifically, according to the invention, the stress energy due to the development of nitrogen gas is usefully consumed as energy for breaking the boundary portion between the epitaxial growth substrate portion of the non-laser irradiated area and the epitaxial growth substrate portion of the laser irradiated area and moving fragments of the epitaxial growth substrate of the laser irradiated area that is no longer held.

More specifically, the invention sharply reduces the stress to be applied to the supporting substrate, the conductive layer, and the Group III nitride compound semiconductor layer (epitaxial layer). Thus, the element characteristics of the Group III nitride compound semiconductor element to be finally obtained do not deteriorate and the yield dramatically improves.

In order to effectively direct the stress energy based on the development of the nitrogen gas of a high temperature to the movement of the fragments of the epitaxial growth substrate of the laser irradiated area, the following measure is taken. For example, there is no connecting portion of the substrate on the boundary between the epitaxial growth substrate portion of the non-laser irradiated area and the epitaxial growth substrate portion of the laser irradiated area, i.e., the substrate may be completely divided beforehand in each laser irradiated area. When the connecting portion of the substrate is left on the boundary between the epitaxial growth substrate portion of the non-laser irradiated area and the epitaxial growth substrate portion of the laser irradiated area, the connecting portion needs to be easily broken. The connecting portion of the epitaxial growth substrate is not allowed to be present throughout between the respective unit sections of one laser irradiation, or a groove or a physically processed portion is provided on the connecting portion. Thus, the connecting portion is easily broken by the pressure of nitrogen gas generated by laser irradiation for laser lift-off.

The laser lift-off is carried out after joining between the epitaxial growth substrate on which the epitaxial layer has been formed and the supporting substrate. Therefore, it is substantially impossible, in terms of handling, to completely remove the connecting portion on the boundary of the epitaxial growth substrate between the unit sections of laser irradiation before the joining, because completely removing the connecting portion means that the epitaxial growth substrate is separated in each unit section.

In contrast, it is not preferable that the Group III nitride compound semiconductor layer that has been epitaxially grown be not separated between the unit sections of laser irradiation. More specifically, it is not preferable that an area that is exposed to a high temperature or a stress and an area which is not exposed thereto are present in the Group III nitride compound semiconductor layer that is not separated and continuous. Then, the first grooves that completely separate the Group III nitride compound semiconductor layer in each unit section of laser irradiation is formed on the epitaxial growth substrate from the epitaxial layer side before joining to the supporting substrate. The unit section of laser irradiation may be provided for each element or may be a rectangular section including a plurality of elements, for example. The first grooves need to extend from the epitaxial layer to the interface with the epitaxial growth substrate. The first grooves may reach the inside of the epitaxial growth substrate.

In contrast, by forming the physically processed portion on the rear surface or at the inside of the epitaxial growth substrate after joining of the epitaxial growth substrate and the supporting substrate, the connecting portion which is a boundary between the unit sections of laser irradiation of the epitaxial growth substrate can be eliminated, thinned in the thickness direction of the substrate, or made brittle. For the substrate processing process of forming the physically processed portions on the rear surface or at the inside of the epitaxial growth substrate, the formation of scribe lines on the substrate rear surface by a scriber or the like, the formation of modified portions in the substrate by a narrowly focused laser beam, or the formation of rear surface grooves can be employed, for example. Especially in case of using the formation of laser modified portions in the substrate by a narrowly focused laser beam, the epitaxial growth substrate portion of the laser irradiated area is easily flown away by laser irradiation for laser lift-off with no relation of the thickness of the epitaxial growth substrate only if the laser modified portions can be formed in the epitaxial growth substrate. When the scribe lines on the substrate rear surface and the formation of the modified portions in the substrate by a laser beam are used in combination, the portion of epitaxial growth substrate is absolutely flown away even when the epitaxial growth substrate is more thicker. When the formation of laser modified portions is not used and the combination of using the first grooves and the scribe lines or the rear surface grooves is used, the portion of epitaxial growth substrate is easily flown away even when the thickness of the epitaxial growth substrate is 300 μm or more.

When the formation of laser modified portions is not used and the rear surface grooves are formed and are not communicated with the first grooves, the thickness of the connecting portion (remaining portion) sandwiched between the rear surface grooves and the first grooves that face with each other is preferably 100 μm or lower. When the connecting portion (remaining portion) exceeding 100 μm is left, breakage between the laser irradiated area and the non-laser irradiated is difficult to occur in the area, the epitaxial growth substrate in the irradiated unit section cannot be flown away upon laser irradiation, and a stress due to the development of nitrogen gas of a high temperature is applied to, for example, the epitaxial layer. Thus, the connecting portion exceeding 100 μm is not preferable. The thickness of the connecting portion (remaining portion) is more preferably 60 μm or lower, much more preferably 20 μm or lower.

It is preferable to thin the epitaxial growth substrate prior to the substrate processing process of forming the physically processed portions on the rear surface or at the inside of the epitaxial growth substrate. This is because, when the rear surface grooves are formed, the object can be easily achieved only by forming a shallow one. Also in the case of the formation of the physically processed portions other than the formation of the rear surface grooves, the epitaxial growth substrate portion in the laser irradiated area can be more surely flown away when thinned. Thinning by polishing is easy and preferable.

Since the thinning is carried out after joining the epitaxial growth substrate on which the epitaxial layer has been formed to the supporting substrate, the epitaxial growth substrate may be extremely thinned. However, since the epitaxial growth substrate on which the epitaxial layer containing the Group III nitride compound semiconductor has been formed and the supporting substrate are joined to each other by thermocompression bonding using a solder layer, the substrates are entirely curved due to a difference in the coefficient of linear expansion between the epitaxial growth substrate and the supporting substrate. Therefore, when the curved substrate is thinned to be lower than 5 μm, there arises a problem in that the whole film thickness of the epitaxial growth substrate is partially polished, and thus an area where the epitaxial layer containing the Group III nitride compound semiconductor is polished arises. When thinned to be lower than 5 μm, there also arises a problem in that cracks occur in the growing substrate and the epitaxial layer due to local stress by a polishing agent.

In contrast, in case that the formation of laser modified portions is not used when the film thickness of the epitaxial growth substrate after thinning by polishing exceeds 200 μm, it is necessary to form extremely deep rear surface grooves. In this case, in the vicinity of the area where the grooves are formed during the groove formation, cracks or chipping may occur in the epitaxial growth substrate and the epitaxial layer. In the thinning process, it is more preferable to adjust the thickness of the epitaxial growth substrate to 150 μm or lower, much more preferably 60 μm or lower.

When the thinning process is carried out by polishing, it is preferable to use a coarse-grained polishing agent in terms of shortening of production time. In that case, it is preferable to mirror finish the rear surface of the epitaxial growth substrate. Thus, scattering of a laser beam can be prevented during of laser lift-off. The square root of the root mean square (RMS) of a difference in height of irregularities may be adjusted to 100 nm or lower, for example.

The Group III nitride compound semiconductor element obtained in the invention has less deterioration of element characteristics due to the actions described above. More specifically, an extremely high yield can be achieved by the method for producing the Group III nitride compound semiconductor element of the invention.

BRIEF DESCRIPTION OF THE DRAWINGS

FIG. 2.A is a flow chart (cross sectional view) illustrating one process of a production method according to Example 1 of the invention;

FIG. 2.B is a flow chart (cross sectional view) illustrating one process of the production method according to Example 1;

FIG. 2.C is a flow chart (cross sectional view) illustrating one process of the production method according to Example 1;

FIG. 2.D is a flow chart (cross sectional view) illustrating one process of the production method according to Example 1;

FIG. 2.E is a partially enlarged view (cross sectional view) of the flow chart of FIG. 2.D;

FIG. 2.F is a flow chart (cross sectional view) illustrating one process of the production method according to Example 1;

FIG. 2.G is a flow chart (cross sectional view) illustrating one process of the production method according to Example 1;

FIG. 2.H is a flow chart (cross sectional view) illustrating one process of the production method according to Example 1;

FIG. 2.I is a partially enlarged view (cross sectional view) of the flow chart of FIG. 2.H;

FIG. 2.J is a flow chart (cross sectional view) illustrating one process of the production method according to Example 1;

FIG. 2.K is a partially enlarged view (cross sectional view) of the flow chart of FIG. 2.J;

FIG. 2.L is a flow chart (cross sectional view) illustrating one process of the production method according to Example 1;

FIG. 2.M is a partially enlarged view (cross sectional view) of the flow chart of FIG. 2.L;

FIG. 2.N is a flow chart (cross sectional view) illustrating one process of the production method according to Example 1;

FIG. 2.O is a flow chart (cross sectional view) illustrating one process of the production method according to Example 1;

FIG. 2.P is a flow chart (cross sectional view) illustrating one process of the production method according to Example 1;

FIG. 2.Q is a flow chart (cross sectional view) illustrating one process of the production method according to Example 1;

FIG. 2.R is a flow chart (cross sectional view) illustrating one process of the production method according to Example 1;

FIG. 2.S is a flow chart (cross sectional view) illustrating one process of the production method according to Example 1;

FIG. 3.A is a flow chart (cross sectional view) illustrating one process of a production method according to Example 2;

FIG. 3.B is a flow chart (cross sectional view) illustrating one process of the production method according to Example 2;

FIG. 5.A is a flow chart (cross sectional view) illustrating one process of a production method according to Example 3;

FIG. 5.B is a flow chart (cross sectional view) illustrating one process of the production method according to Example 3;

FIG. 5.C is a flow chart (cross sectional view) illustrating one process of the production method according to Example 3;

FIG. 5.D is a flow chart (cross sectional view) illustrating one process of the production method according to Example 3;

FIG. 5.E is a partially enlarged view (cross sectional view) of the flow chart of FIG. 5;

FIG. 5.F is a flow chart (cross sectional view) illustrating one process of the production method according to Example 3;

FIG. 5.G is a flow chart (cross sectional view) illustrating one process of the production method according to Example 3;

FIG. 5.H is a flow chart (cross sectional view) illustrating one process of the production method according to Example 3;

FIG. 5.I is a flow chart (cross sectional view) illustrating one process of the production method according to Example 3;

FIG. 5.J is a flow chart (cross sectional view) illustrating one process of the production method according to Example 3;

FIG. 5.K is a flow chart (cross sectional view) illustrating one process of the production method according to Example 3;

FIG. 5.L is a flow chart (cross sectional view) illustrating one process of the production method according to Example 3;

FIG. 5.M is a partially enlarged view (cross sectional view) of the flow chart of FIG. 5.L;

FIG. 5.N is a flow chart (cross sectional view) illustrating one process of the production method according to Example 3;

FIG. 5.O is a partially enlarged view (cross sectional view) of the flow chart of FIG. 5.N;

FIG. 5.P is a flow chart (cross sectional view) illustrating one process of the production method according to Example 3;

FIG. 5.Q is a partially enlarged view (cross sectional view) of the flow chart of FIG. 5.P;

FIG. 5.R is a flow chart (cross sectional view) illustrating one process of the production method according to Example 3;

FIG. 5.S is a flow chart (cross sectional view) illustrating one process of the production method according to Example 3;

FIG. 5.T is a flow chart (cross sectional view) illustrating one process of the production method according to Example 3;

FIG. 5.U is a flow chart (cross sectional view) illustrating one process of the production method according to Example 3;

FIG. 5.V is a flow chart (cross sectional view) illustrating one process of the production method according to Example 3;

FIG. 5.W is a flow chart (cross sectional view) illustrating one process of the production method according to Example 3;

FIG. 6.A is a flow chart (cross sectional view) illustrating one process of a production method according to Example 6;

FIG. 6.B is a flow chart (cross sectional view) illustrating one process of the production method according to Example 6;

FIG. 7.A is a flow chart (cross sectional view) illustrating one process of a production method according to Example 7;

FIG. 7.B is a cross sectional view in a different direction illustrating the same process as Example 7;

FIG. 8.A is a flow chart (cross sectional view) illustrating one process of a production method according to Example 8;

FIG. 8.B is a cross sectional view in a different direction illustrating the same process as in Example 8A;

DESCRIPTION OF THE PREFERRED EMBODIMENTS

Figure 1:
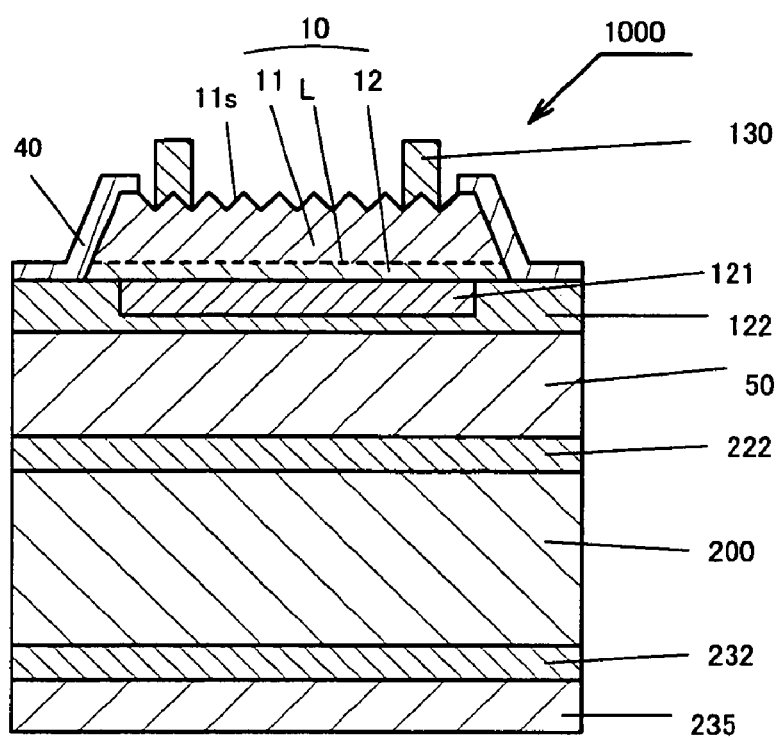
FIG. 1 is a cross sectional view illustrating the structure of a Group III nitride compound semiconductor element (Blue LED) obtained by a production method of the invention.

In implementation of the invention, a relatively thick substrate of about 500 μm can be used for each of an epitaxial growth substrate and a conductive supporting substrate, and thus handling is facilitated. When cutting by a laser, for example, is applied to finally dividing into each element, the supporting substrate may be thinned to 100 μm to 200 μm, and then an electrode layer may be formed on the rear surface.

It is preferable to design a laser irradiated area (shot area) for laser lift-off so that the outer periphery of the laser irradiated area (shot area) is not present in the inner area of each chip to be finally obtained. The outer periphery of the laser irradiated area (shot area) is a boundary between an area where the Group III nitride compound semiconductor layer is decomposed and an area where the Group III nitride compound semiconductor layer is not decomposed in the vicinity of the interface in contact with the epitaxial growth substrate. This is because not a little stress breakage occurs in the chip when the boundary between a portion where there is no jointing between the epitaxial growth substrate and the epitaxial layer and a portion where there still remains jointing between the epitaxial growth substrate and the epitaxial layer crosses each chip. For example, when the planar shape of the chip is a square or the like, the laser irradiated area (shot area) may be adjusted to the same size as the chip size or may be adjusted to be in agreement with a square area where a plurality of chips are combined. In either case, it is structured so that the outer periphery of the laser irradiated area (shot area) is present on the final break line of each chip.

When a modified portion is formed in the epitaxial growth substrate by a laser beam, the laser modified portion may be formed along the boundary (interface) serving as the outline of the laser irradiated area during laser lift-off. In the laser modified portion, the boundary (interface) serving as the outline does not need to be thoroughly formed, and may be formed at an appropriate interval. Moreover, according to the thickness of the epitaxial growth substrate, the laser modified portion may be formed in multi stages in the thickness direction. For the above process, the technique described in Patent Document 2, for example, may be used.

When scribe lines are formed on the rear surface of the epitaxial growth substrate, a diamond scriber can be used, for example. The depth of the scribe lines is preferably 0.1 μm or more to 20 μm or lower and more preferably 0.3 μm or more to 5 μm or lower.

As a method for forming the rear surface groove of the epitaxial growth substrate, a known arbitrary method, such as a dicing process by a dicer, etching by blasting, or etching by laser beam processing, can be employed. Since the epitaxial growth substrate does not remain in the Group III nitride compound semiconductor element to be finally obtained, the method for forming the rear surface groove is not limited.

Since the epitaxial growth substrate is fragmented and flown away during laser lift-off, air blow, for example, may be carried out so that the fragments do not fall on the epitaxial growth substrate of the non-laser irradiated area or the epitaxial layer on the surface of the supporting substrate.

The first grooves, the rear surface grooves, the scribe lines, or the laser modified portions, which are physically processed portions, formed by the invention need to be in substantially agreement with the outer periphery of each laser irradiated area (shot area). More specifically, on the outer periphery of each laser irradiated area (shot area), it is preferable that there is no portion where the first grooves, the rear surface grooves, the scribe lines, or the laser modified portions, which are the physically processed portion, are not formed. The first grooves and the rear surface grooves, the scribe lines, or the laser modified portions, which are physically processed portions, may be provided in such a manner as to, for example, cross a portion serving as the inside of each laser irradiated area (shot area). However, it is not always necessary to provide the same in such a manner as to cross each laser irradiated area. Providing the same in such a manner as to cross each laser irradiated area is useful for separating each laser irradiated area (shot area) from the epitaxial growth substrate, while combining a plurality of chips.

The first grooves may be communicated with the outside of a wafer. For example, the first grooves may be formed in such a manner as to reach the outer periphery of the epitaxial growth substrate also in an area where no chips are formed in the vicinity of the outer periphery of the epitaxial growth substrate. The side surfaces of the first grooves may be finally removed. When the side surfaces of the first grooves are finally removed, a p type layer and an n type layer of the epitaxial layer serving as the side surfaces when the first grooves are formed may be short circuited when or after the first grooves are formed. This is because a short circuited bridge portion is finally removed, and thus the short circuit of the p layer and the n layer of each chip is released. In this respect, a technique to be employed in the first groove formation process is selected from an extremely wide variety of options. For example, dicing by a dicer, dry etching using a mask, melting or decomposition by laser irradiation, or etching by sandblasting can be employed.

Second grooves formed by the invention are formed so that the epitaxial layer forming each chip may be separated in each chip. In a process of forming the second groove, it is not preferable that the p type layer and the n type layer be short circuited on the outer peripheral side surface of the epitaxial layer. Therefore, a technique to be employed in the second groove formation process is selected from a relatively small number of options. Dry etching is preferable. When the second grooves are formed, the epitaxial layer forming the first grooves may be removed, and the epitaxial layer between each first groove and the outer periphery of each chip may be removed while leaving the epitaxial layer on the side surfaces of the first grooves. When the epitaxial layer on the side surfaces of the first grooves is left in the second groove formation process, the epitaxial layer on the side surfaces of the first grooves may be removed by a process of cutting the supporting substrate.

For the supporting substrate cutting process, any cutting process can be used. In this case, small pieces of a metal or other conductive layer and a conductive supporting substrate may fly away and adhere. Thus, it is important to prevent the occurrence of short circuit of the p type layer and the n type layer in the supporting substrate cutting process by forming an insulating protective film after the second groove formation process. A technique to be employed as a cutting process is selected from an extremely wide variety of options. A combination of half cutting by a dicer or the like and mechanical cutting or decomposition by laser irradiation is also preferable.

EXAMPLE 1

FIG. 1 is a cross sectional view illustrating the structure of a Group III nitride compound semiconductor element (Blue LED) obtained by a production method according to one specific Example of the invention.

The Group III nitride compound semiconductor element (Blue LED) 1000 of FIG. 1 has a laminated structure containing a conductive layer 222 containing a laminate of a plurality of metals, a solder layer 50 which is a low melting point alloy layer, a conductive layer 122 containing a laminate of a plurality of metals, a p contact electrode 121, a p type layer 12 containing a single layer or a multilayer of mainly a p type Group III nitride compound semiconductor layer, a light emitting region L, an n type layer 11 containing a single layer or a multilayer of mainly an n type Group III nitride compound semiconductor layer, and an n contact electrode 130 from the side of the supporting substrate 200 on the surface of a conductive supporting substrate 200 serving as a p type silicon substrate.

When the description of Claims and the structure of this Example are compared, the "conductive layer" of Claims refers to the conductive layer 222, the solder layer (solder layer) 50, the conductive layer 122, and the p contact electrode 121.

The outer peripheral side of one element of the p type layer 12 and the n type layer 11 with the light emitting region L sandwiched therebetween is covered with the insulating protective film 40. The horizontal cross sectional area of the p type layer 12 and the n type layer 11 (hereinafter sometimes collectively referred to as an epitaxial layer 10) gradually decreases from the side of the supporting substrate side 200 to the side of a contact electrode 130 of the n type layer 11. Therefore, the outer peripheral side surface of the epitaxial layer 10 covered with the insulating protective film 40 is inclined (forward tapered) from the upper side on which the n contact electrode 130 has been formed toward the lower side which is the side of the supporting substrate side 200.

In order to increase a light extraction efficiency, a surface 11s having fine irregularities is formed on the n type layer 11. On the rear surface of the supporting substrate 200, a conductive layer 232 containing a laminate of a plurality of metals and a solder layer (solder layer) 235 are formed.

In this Example, each layer is constituted as follows.

The conductive layer 222 containing a laminate of a plurality of metals is a layer in which titanium (Ti), nickel (Ni), and gold (Au) are laminated in this order from the side of the supporting substrate 200. The conductive layer 232 containing a laminate of a plurality of metals is a layer in which platinum (Pt), titanium (Ti), and gold (Au) are laminated in this order from the side of the supporting substrate 200. The solder layers 50 and 235 each are formed with a solder containing an alloy of gold and tin (Au—Sn). The P contact electrode 121 is formed with a silver (Ag) alloy. The conductive layer 122 containing a laminate of a plurality of metals is a layer in which titanium (Ti), titanium nitride (TiN), titanium (Ti), nickel (Ni), and gold (Au) are laminated in this order from the side in the vicinity of the p type layer 12 and the p contact electrode 121. In the conductive layers 222, 232 and 122, the nickel (Ni) layer is a layer for preventing diffusion of tin (Sn) in the solder layer (solder layer) 50 or 235 and the titanium (Ti) layer is a layer for increasing the adhesiveness of the conductive layers 222, 232, and 122 to the jointing surface.

The n contact electrode 130 has a laminated structure in which aluminum (Al), titanium, nickel (Ni), and gold (Au) are laminated in this order from the side of the n type layer 11.

The insulating protective film 40 contains silicon nitride ($Si_3N_4$).

The Group III nitride compound semiconductor element (Blue LED) 1000 of FIG. 1 was produced as follows. FIGS. 2.A to 2.S illustrate the flow chart (cross sectional view) in this case.

FIGS. 2.E, 2.I, 2.K, and 2.M each are flow charts and FIGS. 2.D, 2.H, 2.J, and 2.L each are partially enlarged views.

The n type layer 11 and the p type layer 12 were epitaxially grown in order on the sapphire epitaxial growth substrate 100 having a thickness 500 µm to thereby form the epitaxial layer 10 (FIG. 2.A). In FIG. 2.A, the light emitting region L is simply indicated by the thick dashed line, but, in actual, is formed by a MQW structure.

Next, first grooves tr-1 that function as an air vent during laser lift-off were formed by a dicer 1. The first grooves tr-1 were formed by removing the p type layer 12 and the n type layer 11 in a total film thickness of about 4 µm and the epitaxial growth substrate 100 in a depth of about 10 µm. The width of the first grooves tr-l was adjusted to about 20 µm (FIG. 2B).

Next, an Ag alloy layer was formed on the entire surface by a sputtering device, a resist mask was formed on the entire surface, and then it was exposed to light and developed to be formed into a given pattern. Then, the Ag alloy layer of a portion that was not masked was etched, the resist mask was removed, and then the Ag alloy layer and the p type layer 12 were alloyed by heating, thereby forming the p contact electrode 121 (FIG. 2C).

Next, a Ti layer, a TiN layer, a Ti layer, an Ni layer, and an Au layer were formed in this order on the entire surface of the wafer by a sputtering device. These five layers are collectively indicated as the conductive layer 122. The TiN layer which is a compound layer needs to be formed by a sputtering device, the Ti layer, the Ni layer, and the Au layer formed after the formation of the TiN layer may be formed by vapor deposition.

Moreover, an AuSn layer and an Au layer were formed on the entire surface of the wafer by a resistance heating vapor deposition device, thereby obtaining the solder layer 125. The Au layer is a thin film for preventing oxidation of tin (Sn) (FIG. 2.D).

Here, even when the conductive layer 122 and the solder layer 125 cover the first grooves tr-1, this causes no problems insofar as the first grooves tr-1 are communicated with the outside of the periphery of the wafer and function as an air vent during laser irradiation for laser lift-off. As illustrated in FIG. 2.E, the conductive layer 122 and the solder layer 125 may be thickly formed on the bottom surface of the first grooves tr-1. However, the conductive layer 122 and the solder layer 125 are not formed on side walls vnt of the first grooves tr-1 or, even when formed, the thickness is extremely thin. When the conductive layer 122 and the solder layer 125 formed on the side walls vnt of the first grooves tr-1 are thin in FIG. 2.E, the side surfaces of the conductive layer 122 and the solder layer 125 are easily fractured by nitrogen gas generating on the interface 11sf of the n type layer 11 and the epitaxial growth substrate 100, and the nitrogen gas is discharged to the outside through the first grooves tr-1. More specifically, even when the first grooves tr-1 are formed in advance, and then the conductive layer 122 and the solder layer 125 are formed as in this Example, the first grooves tr-1 do not lose the function as an air vent and thus the nitrogen gas generated during laser lift-off is easily discharged.

Thus, in the invention, the first grooves tr-1 are formed so that the bottom surface includes the epitaxial growth substrate 100 and the side surface includes the side surfaces of the epitaxial layer 10. However, in terms of a function required in the first grooves tr-1, it is not necessary that the epitaxial growth substrate 100 is exposed to the bottom surface of the first grooves tr-1 and the epitaxial layer 10 is exposed to the side surfaces of the first grooves tr-1. The function required in the first grooves tr-1 is a function of enabling the nitrogen gas generated on the interface 11sf of the n type layer 11 and the epitaxial growth substrate 100 to be discharged to the outside through the cavity of the first grooves tr-1. In this respect, the first grooves tr-1 do not need to be a rectangular shape containing the bottom surface and the side surface and may function as a cavity in the following description. Even when elements constituting the conductive layer 122 and the solder layer 125 cover the side surfaces of the first grooves tr-l as a thin film during the formation of the conductive layer 122 and the solder layer 125 after the formation of the first grooves tr-1, this causes no problems insofar as the function as a cavity through which the nitrogen gas is discharged to the outside after joining to the supporting substrate 200 is not impeded. The depth of the first grooves tr-1 formed after the deposition of the conductive layer 122 and the solder layer 125 illustrated in FIG. 2.D and FIGS. 2.G to 2.J is larger than the depth of the first grooves tr-l illustrated in FIG. 2.B. However, even when the depth is increases, the meaning as the cavity does not change. Thus, the first grooves are indicated as the same first grooves tr-1.

Next, the conductive layer 222 containing a Ti layer, an Ni layer, and an Au layer and the solder layer 225 containing an AuSn layer and an Au layer are formed by a resistance heating vapor deposition device on the entire surface on the silicon supporting substrate 200 having a thickness of 500 µm. The Au layer is a thin film for preventing oxidation of tin (Sn).

Next, the epitaxial layer 10 of the epitaxial growth substrate 100 and the supporting substrate 200 are faced with each other, and then joined to each other by the solder layers 125 and 225. The solder layers 125 and 225 are so-called low melting point alloy layers. The heating temperature was 320° C. and the pressure was 196 kPa (about 2 atmospheres, 2 kgf/cm²) (FIG. 2.F).

In this case, two layers of Au thin films between two AuSn layers are absorbed in the AuSn layer to form one AuSn layer. Hereinafter, a layer in which the solder layers 125 and 225 are unified is indicated as the solder layer 50 (FIG. 2.G).

Next, laser lift-off is carried out. The vicinity of the interface 11sf of the n type layer 11 of the epitaxial layer and the sapphire epitaxial growth substrate 100 is irradiated with a laser to decompose the thin film interface portion of the n type layer 11. In this case, the laser irradiated area (shot area) is formed into a 2 mm square region containing 16 square chips formed in a 500 μm pitch. Thus, as illustrated in FIG. 2.G, the thin film portion of the n type layer 11 in the vicinity of the interface 11sf of the n type layer 11 and the sapphire epitaxial growth substrate 100 was completely decomposed. Thus, the joining of the n type layer 11 and the epitaxial growth substrate 100 was released, and the epitaxial growth substrate 100 was separated from the n type layer 11 (FIG. 2.H). Since the first grooves tr-1 were communicated with the outside of the wafer, the generated nitrogen gas was promptly discharged to the outside of the wafer through the first grooves tr-1. Therefore, even when a high pressure due to the gas generated on the interface of the n type layer 11 and the epitaxial growth substrate 100 by laser irradiation occurs, only a low load is applied to the epitaxial layer 10, the epitaxial growth substrate 100, the supporting substrate 200, and each conductive layer formed therebetween. Therefore, it is finally confirmed that no separation or no cracks do not occur in the supporting substrate 200 or each layer.

The bottom surface and a portion of the side surfaces of the first grooves tr-1 are formed on the sapphire substrate 100. The conductive layer 122 and the solder layer 125 formed on the bottom surface and the side surfaces of the first grooves tr-1 were removed with the sapphire substrate 100 (FIG. 2.I, a partially enlarged view of FIG. 2.H).

Next, by dry etching using a mask, an area including the first grooves tr-1 and having a width wider than that of the first grooves tr-1 was removed, thereby forming second grooves tr-2 along the outer periphery of the chip of the epitaxial layer 10 (FIG. 2.J).

In this case, as an etching mask, a mask formed into a given pattern by photolithography after SiO$_2$ was formed by CVD was used. A part of the side surfaces of the first grooves tr-1 were formed in the epitaxial layer 10 containing the n type layer 11 and the p type layer 12. The conductive layer 122 and the solder layer 125 (dashed line oval inner area designated as M in FIG. 2.I) formed on the side surfaces of the first grooves tr-1 which are parts of the epitaxial layer 10 were removed with the epitaxial layer 10 (FIG. 2.K).

The epitaxial growth substrate 100 constituting the bottom surface of the grooves during the formation of the first grooves tr-1 is no longer present after lift-off. However, in FIG. 2.I, the first groove tr-1 formed on the epitaxial growth substrate 100 is virtually illustrated by the dashed line. The side surfaces of the n type layer 11 and the p type layer 12 constituting the side surfaces of the first groove tr-1 during the formation thereof are etched and are not present after the second grooves tr-2 were formed. However, in FIG. 2.K, the first groove tr-1 constituted by the side surfaces of the n type layer 11 and the p type layer 12 that were present is virtually illustrated by the dashed line. This is because it is necessary to illustrate the formation position of each second groove tr-2 as compared with the formation position of each first groove tr-1 in FIG. 2.J. For facilitating the understanding of the positional relationship, the imaginary first groove tr-1 is illustrated by the dashed line also in the flow charts where the side surfaces of the epitaxial growth substrate 100 or the n type layer 11 are not actually present.

Next, in order to form the insulating protective film 40, SiN was formed on the entire surface of the wafer by CVD (FIG. 2.L). In this case, the insulating protective film 40 containing SiN is once deposited also on the bottom at the side of the solder layer 50 of the first groove tr-1 (FIG. 2.M).

Next, a portion except the outer periphery of each element which is a required portion in the SiN insulating protective film 40 is removed by dry etching to expose a surface 11f to the center of the n type layer 11 (FIG. 2.N). The exposed surface 11f of the n type layer 11 is (000-1) plane, i.e., -c plane, and is likely to be etched.

Then, the exposed surface 11f of the n type layer 11 of the wafer was immersed in an aqueous potassium hydroxide solution (KOHaq) having a concentration of 1 mol/L (1M), and allowed to stand at 60° C., thereby forming a finely irregular surface 11s on the exposed surface 11f (FIG. 2.O).

Next, using the resist mask, an Al layer, a Ti layer, an Ni layer, and an Au layer were laminated in this order on a given area of the exposed surface 11f of the n type layer 11 to thereby form an n electrode 130 (FIG. 2.P).

Next, the rear surface of the silicon supporting substrate 200 was polished to thereby decrease the thickness to 120 μm (FIG. 2.Q).

On the polished surface of the silicon supporting substrate 200, the conductive layer 232 containing a Pt layer, a Ti layer, and an Au layer and a solder layer 235 containing an AuSn layer and an Au layer were vapor deposited (FIG. 2.R). The Au layer is a thin film for preventing oxidation of tin (Sn). The solder layer 235 may not be formed.

Next, the supporting substrate 200 was cut using a laser (FIG. 2.S). As illustrated in FIG. 2.S, an inner area C between the two dashed lines is decomposed and melted by a laser, and each element was separated in this area. Thus, the Group III nitride compound semiconductor element (Blue LED) 1000 of FIG. 1 was obtained. In the Group III nitride compound semiconductor element (Blue LED) 1000 thus obtained, the acceptance ratio of chips obtained from one epitaxial growth substrate 100 (supporting substrate 200) was 95%, and an extremely high yield was exhibited.

EXAMPLE 2

In Example 1, the second grooves tr-2 were formed so that the first grooves tr-1 were present in the area as illustrated in FIG. 2.J which is a flow chart and FIG. 2.K which is an enlarged view of the vicinity of the first grooves. In this case, the side surfaces of the epitaxial layer 10 forming the first grooves tr-1 were also removed.

However, the second grooves tr-2 may be formed so that the first grooves tr-1 are not present in the area. More specifically, the second grooves tr-2 were formed while leaving the side surfaces of the epitaxial layer 10 forming the first grooves tr-1, and the first grooves tr-1 may be removed in the process of cutting the supporting substrate 200. This method is defined as Example 2 and will be described using FIGS. 3.A and 3.B.

FIG. 3.A is an enlarged view illustrating the vicinity of the first grooves tr-1 and the second grooves tr-2 after the second grooves tr-2 were formed by the production method of this Example.

In Example 1, the side surfaces of the epitaxial layer 10 forming the first grooves tr-1 were also removed during the formation of the second grooves tr-2. FIG. 2.K illustrates that the portion (dashed line oval inner area designated as M in FIG. 2.I) of the conductive layer 122 and the solder layer M5 formed on the side surfaces of the epitaxial layer 10 was removed.

In contrast, in this Example, the second grooves tr-2 are formed on both sides of the first grooves tr-1, and the formation areas of the two second grooves tr-2 do not overlap with the formation area of the first grooves tr-1 as illustrated in FIG. 3.A. Therefore, the side surfaces of the epitaxial layer 10 forming the first grooves tr-1 are not removed. Thus, the portion (dashed line oval inner area designated as M in FIG. 2.I) of the conductive layer 122 and the solder layer 125 formed on the side surface thereof is not removed (FIG. 3.A).

Etching for forming the second grooves tr-2 may be carried out by covering the first grooves tr-1 with an etching mask.

When etching is carried out including the first grooves tr-1 in order to form the second grooves tr-2 as in Example 1, a metal piece which is a portion (dashed line oval inner area designated as M in FIG. 2.I) of the conductive layer 122 and the solder layer 125 is not always etched. As a result, the remaining metal pieces are separated and adhere to the exposed side surfaces of the n type layer 11 and the p type layer 12 of the epitaxial layer, sometimes causing short circuiting between both the layers. In this Example 2, the first grooves tr-1 are masked, and thus are not etched during the formation of the second grooves tr-2. Therefore, only the metal pieces do not separate. Therefore, a problem in that the n type layer 11 and the p type layer 12 are short circuited does not arise.

Moreover, metal contamination due to the metal pieces remaining on an etching chamber is prevented. Thus, the elements are not contaminated with metal in another etching process using the etching chamber.

Next, the insulating protective film was formed, and then the supporting substrate was cut in each element. In the cutting process, the inner area C between the two dashed lines is decomposed by a laser, and separated into each element as illustrated in FIG. 3.B.

MODIFIED EXAMPLE

Figure 4:
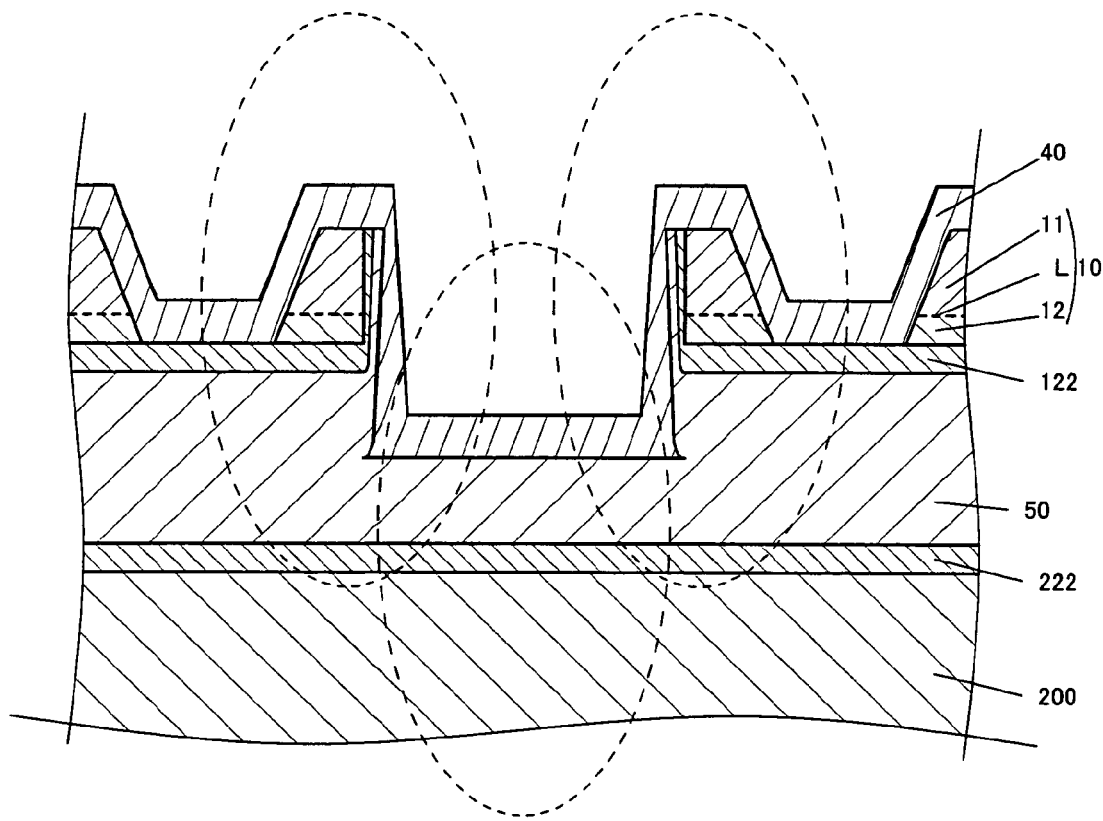
FIG. 4 is a flow chart (cross sectional view) illustrating one process of a production method according to a modified example.
Figure 9:
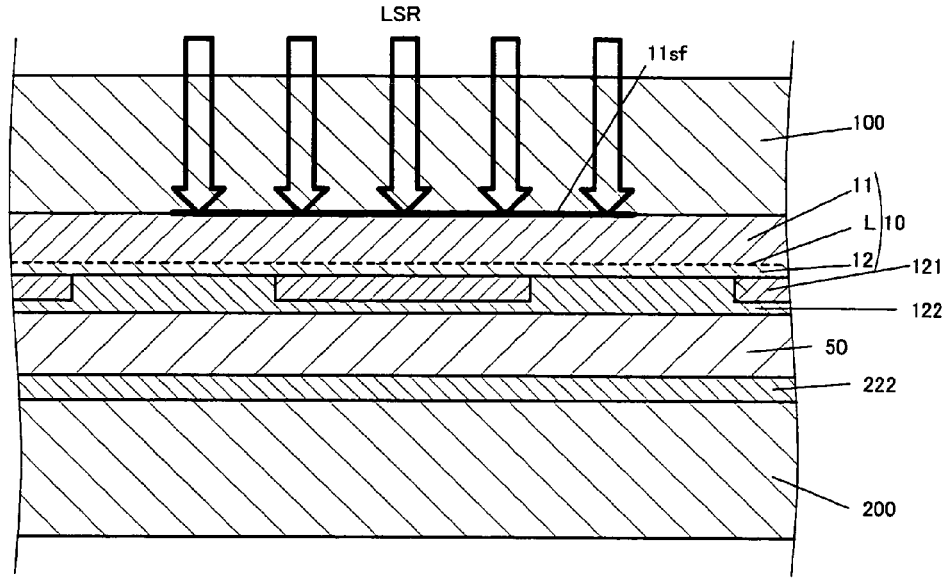
FIG. 9 is a flow chart (cross sectional view) illustrating one process of a production method according to a former example.
Figure 10:
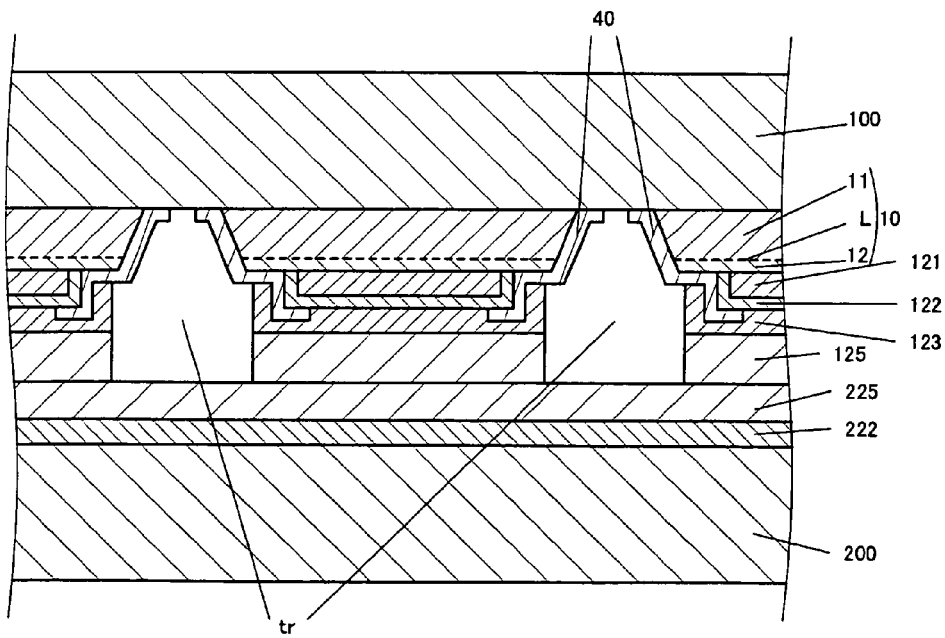
FIG. 10 is a flow chart (cross sectional view) illustrating one process of another production method according to a former example.

In a supporting substrate cutting process, laser irradiation for cutting (separation) may be carried out several times at a plurality of portions. For example, as illustrated in FIG. 4, a plurality of dashed line oval inner areas were decomposed or melted by laser irradiation. The substrate may be cut with a wider width by changing the laser irradiation position.

As an advantage of this technique, omitting of the thinning of the supporting substrate 200 prior to the supporting substrate cutting process of Example 1 is mentioned. Or, when the formation of the first grooves carried out by a dicer in Example 1 was carried out by laser irradiation, the laser irradiation in the supporting substrate cutting process can be carried out while adjusting the focusing degree and the output to be the same as those in the formation of the first grooves.

EXAMPLE 3

The structure of the Group III nitride compound semiconductor element (Blue LED) 1000 obtained by a production method of Example 3 of the invention is the same as the structure of the element obtained by the production method of Example 1 as illustrated in FIG. 1.

The Group III nitride compound semiconductor element (Blue LED) 1000 of FIG. 1 was produced as follows. FIGS. 5.A to 5.W illustrate the flow chart (cross sectional view) in this case.

FIGS. 5.E, 5.M, 5.O, and 5.Q are partially enlarged views of the flow charts of FIGS. 5.D, 5.L, 5.N, and 5.P.

The growing process of each layer, the formation process of the first grooves tr-1, the formation process of the p contact electrode 121, the formation process of the conductive layer 122, and the joining process of the supporting substrate 200 from FIGS. 5.A to 5.G are the same as the processes from FIG. 2.A to FIG. 2.G in Example 1, and thus the descriptions thereof are omitted.

Similarly as in Example 1, the joining structure of the epitaxial growth 100 and the supporting substrate 200 illustrated in FIG. 5.G is obtained.

Next, a rear surface 100b of the sapphire epitaxial growth substrate 100 having a thickness of 500 µm is polished using a polishing agent, and the epitaxial growth substrate 100 is polished to reduce the thickness to 100 µm. Next, the rear surface 100b of the thinned sapphire epitaxial growth substrate 100 is mirror finished by chemical polishing. In this case, mechanical polishing may be carried out using a finer polishing agent in place of the polishing agent used in the thinning process. Thus, the irregularities of the rear surface 100b were adjusted to 100 nm or lower in terms of square root of the root mean square (RMS) (FIG. 5.H).

Next, rear surface grooves tr-b were formed from the rear surface 100b of the sapphire epitaxial growth substrate 100 whose rear surface 100b was mirror finished. The rear surface grooves tr-b were formed at the position facing each first groove tr-1. The depth of the rear surface grooves tr-b was adjusted to 30 µm and the thickness of a connecting portion (remaining portion) 100cn between the first grooves tr-1 having a depth of about 10 µm and the rear surface grooves tr-b was adjusted to about 60 µm (FIG. 5.I).

Next, laser lift-off is carried out. The vicinity of the interface 11sf of the n type layer 11 of the epitaxial layer and the sapphire epitaxial growth substrate 100 is irradiated with a laser to thereby decompose the thin film portion of the n type layer 11. In this case, the laser irradiated area (shot area) is formed into a 2 mm square region containing 16 square chips formed in a 500 µm pitch. Thus, as illustrated in FIG. 5.I, the thin film portion of the n type layer 11 in the vicinity of the interface 11sf of the n type layer 11 and the sapphire epitaxial growth substrate 100 was completely decomposed, the joining of the epitaxial growth substrate 100 with the supporting layer through the n type layer 11 was released, and the epitaxial growth substrate 100 was separated. The details in this case are as follows.

FIGS. 5.J and 5.K illustrate the separation of the sapphire substrate chip 100c for one 2 mm square region. As illustrated in FIG. 5.J, the sapphire substrate chip 100c is a portion of the sapphire epitaxial growth substrates 100 and is separated from the remaining portion of the sapphire epitaxial growth substrate 100 by breakage of the connecting portion (remaining portion) 100cn (FIG. 5.K). The first grooves tr-1 and the rear surface grooves tr-b are formed into a lattice shape so that the wafer obtained by joining the epitaxial growth substrate 100 to the supporting substrate 200 is divided in 2 mm square regions adjacent to each other to the outermost periphery. Since the 2 mm square region is not formed in an area in contact with the outermost periphery of the wafer, the area is smaller than the 2 mm square region. Thus, when the first grooves tr-1 and the rear surface grooves tr-b are formed, a part of the outline of the small area of the outermost periphery is in agreement with the outer periphery of the wafer. When a laser is emitted while successively moving from the area of the outer periphery of the wafer to the square regions of the wafer, nitrogen gas can be efficiently discharged to the outside of the wafer.

Since a large amount of nitrogen gas or the like of a high temperature develops in an extremely short time by laser irradiation during laser lift-off, the stress concentrates on the connecting portion (remaining portion) 100cn with the remaining portion of the epitaxial growth substrate 100. Furthermore, the pressure of the nitrogen gas is converted to energy with which the sapphire substrate chip 100c is flown away in the upper direction in the drawings after the breakage of the connecting portion (remaining portion) 100cn. This action similarly occurs when the laser irradiated area is present in the periphery including a portion of the periphery of the wafer.

Thus, by successively emitting a laser from one section of the outermost periphery of the wafer, the n type layer 11 in the vicinity of the interface 11sf of the n type layer 11 and the sapphire epitaxial growth substrate 100 of each section is decomposed. The connecting portion (remaining portion) 100cn of the sapphire substrate chip 100c of the laser irradiated area and the epitaxial growth substrate 100 to which the laser is not emitted of each section is broken, and the sapphire substrate chip 100C of the laser irradiated area is flown away in the upper direction. The separated sapphire substrate chip 100c is flown away by air blow to a position where the chip does not fall again on the wafer. Thus, when the epitaxial growth substrate 100 is removed by laser lift-off, a stress applied to the epitaxial layer 10, the silicon supporting substrate 200, and each layer formed therebetween which is a conductive layer can be sharply reduced. Thus, the sapphire epitaxial growth substrate 100 is completely removed as illustrated in FIG. 5.L. The conductive layer 122 and the solder layer (solder layer) 125 formed on the bottom surface and the side surfaces of a portion constituted by the sapphire substrate 100 of the first grooves tr-1 were removed with the sapphire substrate 100 (FIG. 5.M, partially enlarged view of FIG. 5.L).

The action of the first grooves tr-1 is as follows. Since the first grooves tr-1 are communicated with the outside of the wafer, the generated nitrogen gas is discharged to the outside of the wafer through the first grooves tr-1. Therefore, only a low load is applied to the epitaxial layer 10, the supporting substrate 200, and each conductive layer formed therebetween by laser irradiation. It is confirmed by an experiment that separation or cracks do not occur in the epitaxial layer 10, the supporting substrate 200, and each conductive layer formed therebetween.

Also when the sapphire substrate chips 100c of some portions remain due to a poor process or also when the epitaxial growth substrate 100 partially remaining on the outermost periphery of the wafer, there is an effect of preventing the cracks of the supporting substrate 200 or the separation of each layer described above due to the presence of the first grooves tr-1.

Next, by dry etching using a mask, an area including the first grooves tr-1 and having a width wider than the first grooves tr-1 was removed, thereby forming a second grooves tr-2 along the outer periphery of the chip of the epitaxial layer 10 (FIG. 5.N).

In this case, as an etching mask, a mask obtained by forming an $SiO_2$ film by CVD, and then forming the $SiO_2$ film into a given pattern by photolithography was used. The side surfaces of the first grooves tr-1 were partially formed on the epitaxial layer 10 containing the n type layer 11 and the p type layer 12. The conductive layer 122 and the solder layer 125 (dashed line oval inner area designated as M in FIG. 5.M) formed on the side surfaces of the first grooves tr-1 which are parts of the epitaxial layer 10 were removed with the epitaxial layer 10 (FIG. 5.O).

The epitaxial growth substrate 100 constituting the bottom surface of the grooves during the formation of the first grooves tr-1 is no longer present after lift-off. However, in FIG. 2.M, the first groove tr-1 formed on the epitaxial growth substrate 100 is virtually illustrated by the dashed line. The side surfaces of the n type layer 11 and the p type layer constituting the side surfaces of the first groove tr-1 during the formation thereof are etched and is not present after the second grooves tr-2 were formed. However, in FIG. 5.O, the first groove tr-1 constituted by the side surfaces of the n type layer 11 and the p type layer 12 that were present is virtually illustrated by the dashed line. This is because it is necessary to illustrate the formation position of each second groove tr-2 as compared with the formation position of each first groove tr-1 in FIG. 5.N. For facilitating the understanding of the positional relationship, the imaginary first groove tr-1 is illustrated by the dashed line also in the flow charts where the side surfaces of the epitaxial growth substrate 100 or the n type layer 11 are not actually present.

The formation process (FIGS. 5.P to 5.Q) of the insulating protective film 40, the process of forming irregularities on the exposed surface 11f of the n type layer 11 (FIG. 5.S), the process of forming the n electrode 130 (FIG. 5.T), the process of polishing the rear surface of the supporting substrate 200 (FIG. 5.U), the process of vapor depositing the conductive layer 232 and the solder layer 235 to the polished surface of the supporting substrate 200 (FIG. 5.V), and the process of cutting the supporting substrate 200 (FIG. 5.W) are the same as the respective processes (FIGS. 2.L to 2S) of Example 1, and thus the descriptions thereof are omitted.

Thus, the Group III nitride compound semiconductor element (Blue LED) 1000 of FIG. 1 was obtained. In the Group III nitride compound semiconductor element (Blue LED) 1000 thus obtained, the acceptance ratio of chips obtained from one epitaxial growth substrate 100 (supporting substrate 200) was 95%, and an extremely high yield was exhibited.

EXAMPLE 4

In Example 3 above, the case where, in the rear surface groove formation process, the rear surface grooves tr-b are not communicated with the first grooves tr-1 and the connecting portion (remaining portion) 100cn having a thickness of about 60 µm is present as illustrated in FIG. 5.I is described. In this Example 4, the film thickness of the sapphire epitaxial growth substrate 100 was reduced to be lower than 100 µm, which was specified in Example 3, in the thinning process, the connecting portion (remaining portion) 100cn of Example 3 was removed, and an isolation groove in which the rear surface grooves tr-b were communicated and integrated with the first grooves tr-1 was formed in the rear surface groove formation process, thereby producing a Group III nitride compound semiconductor light emitting element (Blue LED).

More specifically, in this Example 4, the processes of FIGS. 5.A to 5.G were carried out similarly as in Example 3. Next, in the thinning process illustrated in FIG. 5.H, the film thickness of the sapphire epitaxial growth substrate 100 was reduced to 40 µm. Next, in the rear surface groove formation process illustrated in FIG. 5.I in Example 3, the connecting portion (remaining portion) 100cn of Example 3 was removed, and an isolation groove in which the rear surface grooves tr-b were communicated and integrated with the first grooves tr-1 was formed in the rear surface groove formation process. Thereafter, when laser irradiation was carried out, the sapphire substrate chip 100c was promptly flown away without the necessity of breaking the connecting portion (remaining portion) 100cn, which was required in Example 3.

Hereinafter, the Group III nitride compound semiconductor light emitting element (Blue LED) was produced exactly similarly as in the process of FIG. 5.L and the following processes of Example 3. This Group III nitride compound semiconductor light emitting element (Blue LED) was equivalent to the Group III nitride compound semiconductor element (Blue LED) 1000 of Example 1 in the properties, and the acceptance ratio thereof was 96%.

EXAMPLE 5

In Example 3, the second grooves tr-2 were formed so that the first grooves tr-l were present in the area as illustrated in FIG. 5.N that is a flow chart and FIG. 5.O that is an enlarged view of the vicinity of the first grooves thereof. In this case, the side surfaces of the epitaxial layer 10 forming the first grooves tr-1 were also removed.

However, the second grooves tr-2 may be formed so that the first groove tr-1 is not present in the area. More specifically, the second grooves tr-2 may be formed while leaving the side surfaces of the epitaxial layer 10 forming the first grooves tr-1, and the first grooves tr-1 may be removed in the process of cutting the supporting substrate 200. This process is employed in this Example 5. Each process is the same as that of each of FIGS. 3.A and 3.B described in Example 2. The description of the process is also the same as that of Example 2, and thus the description is omitted.

EXAMPLE 6

In place of the process (FIG. 5.I) of forming the rear surface groove tr-b, laser modified portions were formed in the sapphire substrate (epitaxial growth substrate) 100 on the boundary of laser irradiated area unit sections. The Group III nitride compound semiconductor light emitting element 1000 was obtained similarly as in Example 3, except other than the formation of the laser modified portion.

More specifically, in this Example 6, the processes of FIGS. 5.A to 5.H are the same as those of Example 3. After the thinning process of FIG. 5.H, laser modified portions W were formed at the position facing each first groove tr-l in the sapphire epitaxial growth substrate 100. This is illustrated in FIGS. 6.A and 6.B.

FIG. 6.A is a cross sectional view in cross section corresponding to FIGS. 5.A to 5.H. FIG. 6.B is a cross sectional view in the same process as in FIG. 6.A and is a cross sectional view cut along the cut surface perpendicular to the cut surface of the cross sectional view of FIG. 6.A. The laser modified portion W was formed in the shape of a substantially spheroid in the vicinity of the focus of a laser beam introduced from the rear surface (upper direction in the drawings) of the sapphire epitaxial growth substrate 100. Moreover, the laser modified portion W sometimes has leg-shaped cracks.

FIG. 6.B is a cross sectional view along the middle surface of the first groove tr-1 in FIG. 6.A. More specifically, the section tr-1 illustrated at the left end of FIG. 6.B is the exposed side surfaces of each layer described below forming the side surfaces of the first grooves tr-1. More specifically, the section tr-1 illustrated at the left end of FIG. 6.B contains the side surfaces of the sapphire epitaxial growth substrate 100, the side surfaces of the epitaxial layer 10, the side surfaces of the conductive layer 122, and the side surfaces of the solder (solder) layer 50. In order to avoid complicatedness, FIG. 6.B does not illustrate that thin films of the conductive layer 122 and the solder (solder) layer 50 cover the side surfaces of the sapphire epitaxial growth substrate 100 and the side surfaces of the epitaxial layer 10 of the first grooves tr-1, which is illustrated in FIG. 5.E.

The first grooves tr-1 are provided in a lattice shape so that rectangular unit sections of laser irradiated areas are formed. FIG. 6.B is a cross sectional view in which the first grooves tr-1 illustrated in FIG. 6.A are cut on the plane perpendicular to the substrate. Thus, FIG. 6.B also illustrates the first grooves (extending in the direction perpendicular to the sheet of FIG. 6.B) that cross at right angles to the first grooves tr-1 illustrated in FIG. 6.A.

Each laser modified portion W serves as a portion of a fractured surface in the following process, and is heterogeneous from the epitaxial growth substrate 100 therearound due to melting, decomposition, and solidification. Therefore, the laser modified portions W are fractured therebetween due to the pressure of nitrogen gas generated by the decomposition of the n type layer 11 by laser irradiation during laser lift-off in the following process, and the fracture extends to the first grooves tr-1, whereby an expected fractured surface is formed.

As a pulse laser used in order to form the laser modified portions W, ultraviolet light is preferable in terms of a wavelength. The pulse width is preferably 1 microsecond or lower. The energy density may be adjusted to $10^8$ W/cm$^2$ by condensing by a lens. For example, in order to divide the epitaxial growth substrate 100 into chips measuring 300 to 500 μm on each side, 10 or more and preferably 150 to 500 of linear processing-altered portions per one side of each chip extending in the thickness direction are formed.

Laser lift-off following the processes of FIGS. 6.A and 6.B was carried out in the same process as that illustrated in FIG. 5.J or 5.K of Example 3.

The subsequent processes are the same as those of FIGS. 5.L to 5.W of Example 3, and the Group III nitride compound semiconductor light emitting element 1000 illustrated in FIG. 1 was obtained by these processes. The acceptance ratio thereof was 95%.

EXAMPLE 7

The Group III nitride compound semiconductor light emitting element 1000 was obtained by omitting the thinning process (FIG. 5.H) of the sapphire substrate (epitaxial growth substrate) 100, and forming the laser modified portions in the sapphire substrate (epitaxial growth substrate) 100 in two stages as in Patent Document 2 in Example 6.

More specifically, the processes of FIGS. 5.A to 5.G are the same as those of Example 3 in this Example 7. The laser modified portions W were formed in two stages at the position facing each first groove tr-1 in the sapphire epitaxial growth substrate 100 after the joining process of the epitaxial growth substrate 100 and the supporting substrate 200 illustrated in FIG. 5.G. This is illustrated in FIGS. 7.A and 7.B.

FIG. 7.A is a cross sectional view in cross section corresponding to FIGS. 5.A to 5.G. FIG. 7.B is a cross sectional view in the same process as in FIG. 7.A and is a cross sectional view cut along the cut surface perpendicular to the cut surface of the cross sectional view of FIG. 7.A. The laser modified portion W was formed in the shape of a substantially spheroid in the vicinity of the focus of a laser beam introduced from the rear surface (upper direction in the drawings) of the sapphire epitaxial growth substrate 100. Moreover, the laser modified portion W sometimes has leg-shaped cracks.

The laser modified portions W may be formed in, for example, two stages or three stages. In that case, two or three of the laser modified portions W linearly extending in the thickness direction in each stage may be individually formed in alignment or the laser modified portions W may be formed on different lines in each stage. It is necessary that the position of each laser modified portion W is determined in such a manner as to form the same fractured surface substantially perpendicular to the principal surface of the epitaxial growth substrate 100.

The laser lift-off following the processes of FIGS. 7.A and 7.B was carried out by the same process as that illustrated in FIG. 5.J or 5.K of Example 3. The sapphire epitaxial growth substrate 100 was thicker than that illustrated in FIG. 5.J or 5.K. However, the fractured surfaces defined by the first grooves tr-1 and the laser modified portions W provided in multi stages facing therewith are easily formed and the sapphire substrate chips 100C of the laser irradiated area were flown away by the pressure of nitrogen gas generated by decomposition of the epitaxial layer 10 by laser irradiation. In this example the thinning process (FIG. 5.H) of the sapphire substrate may be used. The sapphire substrate chips 100C of the laser irradiated area can be absolutely flown away.

The subsequent processes are exactly the same as those illustrated in FIGS. 5.L to 5.W of Example 3, and the Group III nitride compound semiconductor light emitting element 1000 illustrated in FIG. 1 was obtained by these processes. The acceptance ratio thereof was 95%.

EXAMPLE 8

The Group III nitride compound semiconductor light emitting element 1000 was obtained by forming scribe lines by a diamond scriber on the rear surface of the sapphire substrate (epitaxial growth substrate) 100 before the laser lift-off of FIGS. 5.J and 5.K in Example 7.

More specifically, in this Example 8, the processes of FIGS. 5.A to 5.G are the same as those of Example 3. The laser modified portions W were provided as illustrated in FIG. 7.A (FIG. 7.B illustrating another cross sectional view) similarly as in Example 7, and scribe lines SL were formed at the position facing each first groove tr-1 on the rear surface of the sapphire substrate (epitaxial growth substrate) 100. This is illustrated in FIGS. 8.A and 8.B.

FIG. 8.A is a cross sectional view in cross section corresponding to FIGS. 5.A to 5.G and FIG. 7.A. FIG. 8.B is a cross sectional view in cross section corresponding to FIG. 7.B. FIG. 8.B is a cross sectional view cut along the cut surface perpendicular to the cut surface of the cross sectional view of FIG. 8.A. The position of the scribe lines SL is determined in such a manner as to form the same fractured surface substantially perpendicular to the principal surface of the epitaxial growth substrate 100 by extension of the fracture to the first grooves tr-1 and the laser modified portion W.

In FIG. 6.B of Example 6, the first grooves tr-1 are provided in a lattice shape so that rectangular unit sections of laser irradiated areas are formed. Therefore, FIG. 6.B illustrates the first grooves (extending in the direction perpendicular to the sheet of FIG. 6.B) that cross at right angles to the first grooves tr-1 illustrated in FIG. 6.A. Similarly, also in this Example 8, the scribe lines SL are provided in a lattice shape so that rectangular unit sections of laser irradiated areas are formed. Therefore, the section SL illustrated at the left end of FIG. 8.B is the side surfaces of the scribe lines SL. FIG. 8.B illustrates the scribe lines SL (extending in the direction perpendicular to the sheet of FIG. 8.B) that cross at right angles to the scribe lines SL tr-1 illustrated in FIG. 8.A. The depth of the scribe lines was in the range of 1 to 3 μm.

The formation position of each laser modified portion W may be in contact with each scribe line SL. When the laser modified portions W are formed in the epitaxial growth substrate 100, the laser modified portions W may be formed at a position at a depth of about ⅓ of the thickness of the sapphire epitaxial growth substrate 100 from the scribe lines SL.

The laser lift-off following the processes of FIGS. 8.A and 8.B was carried out in the same manner as in the process illustrated in FIG. 5.J or 5.K of Example 3. The sapphire epitaxial growth substrate 100 was thicker than that illustrated in FIG. 5.J or 5.K. However, the fractured surfaces defined by the first grooves tr-1 and the laser modified portions W and the scribe lines SL facing with the first grooves tr-1 are easily formed and the sapphire substrate chips 100C of the laser irradiated area were easily flown away by the pressure of nitrogen gas generated by decomposition of the epitaxial layer 10 by laser irradiation.

The following processes are the same as those of FIGS. 5.L to 5.W of Example 3. The Group III nitride compound semiconductor light emitting element 1000 illustrated in FIG. 1 was obtained by these processes. The acceptance ratio thereof was 96%.

In Example 8, it is structured so that the laser modified portions W were formed in two stages without thinning the epitaxial growth substrate 100, the scribe lines SL are formed, and thus the fractured surfaces at the time of laser lift-off are easily formed by the laser-modified portions and the scribe lines with the first grooves tr-I. However, when the epitaxial growth substrate 100 is thinned, the fractured surfaces at the time of laser lift-off can be easily formed by the scribe lines SL and the first grooves tr-1 without forming the laser modified portions W. In this case, the epitaxial growth substrates may be thinned to 200 μm or lower.

In the process of the laser lift-off in the invention, the sapphire substrate chip 100C of laser irradiated unit sections containing one to ten or more light emitting elements is connected, at two sides of the unit sections, to the remaining non-laser irradiated epitaxial growth substrate 100. Therefore, during laser lift-off, the sapphire substrate chip 100c is fractured at two sides of these unit sections. Thus, the sapphire substrate chip 100c is easily fractured. Therefore, particularly when the laser modified portions W are formed in the epitaxial growth substrate 100, the thinning of the epitaxial growth substrate 100 is not necessarily required.

Also in Examples 3 to Example 8, the cutting of the supporting substrate illustrated in the modified example of Example 2 as illustrated in FIG. 4 may be carried out. More specifically, as illustrated in FIG. 4, by decomposing or melting the inside of a plurality of dashed line ovals by laser irradiation and the substrate may be cut with a wider width by changing the laser irradiation position.

What is claimed is:

1. A method for producing a Group III nitride compound semiconductor element comprising growing an epitaxial layer comprising a Group III nitride compound semiconductor using a different kind of substrate as an epitaxial growth substrate, adhering a supporting substrate to a top surface of the epitaxial layer through a conductive layer, and then removing the epitaxial growth substrate by a laser lift-off, the method for producing a Group III nitride compound semiconductor element comprising:

a first groove formation comprising forming, before adhesion of the epitaxial layer and the supporting substrate, a first groove that at least reaches an interface between a bottom surface of the epitaxial layer and the epitaxial growth substrate from the top surface of the epitaxial layer formed on the epitaxial growth substrate and acts as an air vent communicating with an outside of a wafer when the epitaxial layer and the supporting substrate are joined to each other;

a second groove formation comprising forming a second groove, after separating the epitaxial growth substrate by the laser lift-off, by removing an outer periphery of the epitaxial layer, the second groove forming a plurality of chips in the epitaxial layer;

an insulating protective film formation comprising forming an insulating protective film that completely covers at least an outer peripheral side surface of the epitaxial layer of each of the chips exposed in the second groove formation; and a supporting substrate cutting comprising cutting the supporting substrate for splitting said plurality of chips in the supporting substrate.

2. The method for producing a Group III nitride compound semiconductor element according to claim 1, wherein a contact electrode is formed on the top surface of the epitaxial layer after the first groove formation.

3. The method for producing a Group III nitride compound semiconductor element according to claim 2, wherein at least one conductive layer covering the contact electrode is formed on an entire surface of the epitaxial growth substrate before the epitaxial layer formed on the epitaxial growth substrate is joined to the supporting substrate.

4. The method for producing a Group III nitride compound semiconductor element according to claim 1, wherein the first groove formation is carried out by a dicer.

5. The method for producing a Group III nitride compound semiconductor element according to claim 1, wherein the first groove formation is carried out by dry etching.

6. The method for producing a Group III nitride compound semiconductor element according to claim 1, wherein the first groove formation is carried out by decomposition of the epitaxial layer by laser irradiation.

7. The method for producing a Group III nitride compound semiconductor element according to claim 1, wherein the second groove formation is carried out by dry etching.

8. The method for producing a Group III nitride compound semiconductor element according to claim 1, wherein side surfaces of the epitaxial layer that surround the first groove are removed in the second groove formation.

9. The method for producing a Group III nitride compound semiconductor element according to claim 1, wherein the supporting substrate cutting is carried out by laser irradiation.

10. The method for producing a Group III nitride compound semiconductor element according to claim 1, further comprising a substrate processing comprising subjecting, to a physical processing, a rear surface or an inside of the epitaxial growth substrate, which comprises a position facing the first groove formed on a front surface of the epitaxial growth substrate, after the supporting substrate is adhered to the epitaxial growth substrate on which the epitaxial layer has been formed.

11. The method for producing a Group III nitride compound semiconductor element according to claim 10, wherein the substrate processing comprises a laser modified portion formation comprising forming a modified portion by laser irradiation in the epitaxial growth substrate, which is a position facing the first groove formed on the front surface of the epitaxial growth substrate.

12. The method for producing a Group III nitride compound semiconductor element according to claim 10, further comprising a thinning of the epitaxial growth substrate by polishing the epitaxial growth substrate from the rear surface before the substrate processing and after the supporting substrate is adhered to the epitaxial growth substrate on which the epitaxial layer has been formed.

13. The method for producing a Group III nitride compound semiconductor element according to claim 12, wherein the thickness of the epitaxial growth substrate is adjusted to 5 μm or more to 200 μm or less by the thinning.

14. The method for producing a Group III nitride compound semiconductor element according to claim 12, wherein the rear surface of the epitaxial growth substrate is mirror finished before the substrate processing and after the thinning.

15. The method for producing a Group III nitride compound semiconductor element according to claim 10, wherein a contact electrode is formed on the top surface of the epitaxial layer after the first groove formation.

16. The method for producing a Group III nitride compound semiconductor element according to claim 10, wherein at least one conductive layer covering the contact electrode is formed on an entire surface of the epitaxial growth substrate before the epitaxial layer formed on the epitaxial growth substrate is joined to the supporting substrate.

17. The method for producing a Group III nitride compound semiconductor element according to claim 10, wherein the first groove formation is carried out by a dicer.

18. The method for producing a Group III nitride compound semiconductor element according to claim 10, wherein side surfaces of the epitaxial layer that surround the first groove are removed in the second groove formation.

* * * * *